(12) United States Patent
Nishida et al.

(10) Patent No.: US 9,299,642 B2
(45) Date of Patent: Mar. 29, 2016

(54) SEMICONDUCTOR DEVICE AND METHOD FOR PRODUCING SAME

(71) Applicant: FUJI ELECTRIC CO., LTD., Kawasaki-shi, Kanagawa (JP)

(72) Inventors: Yuhei Nishida, Matsumoto (JP); Tatsuo Nishizawa, Matsumoto (JP); Masanori Tanaka, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/842,230

(22) Filed: Sep. 1, 2015

(65) Prior Publication Data
US 2015/0371931 A1    Dec. 24, 2015

Related U.S. Application Data

(63) Continuation of application No. PCT/JP2014/062785, filed on May 14, 2014.

(30) Foreign Application Priority Data

Jun. 10, 2013    (JP) .................................. 2013-121931

(51) Int. Cl.
| H01L 21/00 | (2006.01) |
| H01L 23/48 | (2006.01) |
| H01L 23/482 | (2006.01) |
| H01L 21/48 | (2006.01) |
| H01L 23/495 | (2006.01) |

(52) U.S. Cl.
CPC ........ *H01L 23/4822* (2013.01); *H01L 21/4825* (2013.01); *H01L 23/4952* (2013.01); *H01L 23/49575* (2013.01)

(58) Field of Classification Search
CPC ......................... H01L 23/4822; H01L 23/4952
USPC .................. 257/735, 737, 779–784; 438/461, 438/611–614
See application file for complete search history.

(56) References Cited

U.S. PATENT DOCUMENTS

| 7,944,042 B2* | 5/2011 | Yoshihara ............... H01L 23/36 257/690 |
| 2008/0217760 A1 | 9/2008 | Yoshihara et al. |

FOREIGN PATENT DOCUMENTS

| JP | S61-241953 A | 10/1986 |
| JP | H07-263621 A | 10/1995 |
| JP | H09-008223 A | 1/1997 |
| JP | H09-270441 A | 10/1997 |

(Continued)

OTHER PUBLICATIONS

PCT, "International Search Report for International Application No. PCT/JP2014/062785".

*Primary Examiner* — Calvin Lee
(74) *Attorney, Agent, or Firm* — Manabu Kanesaka

(57) ABSTRACT

A semiconductor device includes a frame including a first step portion provided in a ring shape in an inner circumference of one main surface of the frame, a second step portion provided in a ring shape in an inner circumference of another main surface of the frame, and an inner wall provided between the first step portion and the second step portion; a terminal leading from the first step portion to outside; a circuit board fitted to the second step portion; and an adhesive resin bonding the second step portion and the circuit board, and contacting the inner wall and the terminal.

19 Claims, 27 Drawing Sheets

(56) References Cited

FOREIGN PATENT DOCUMENTS

| | | | |
|---|---|---|---|
| JP | 2000-216187 A | 8/2000 |
| JP | 2000-332179 A | 11/2000 |
| JP | 2004-134518 A | 4/2004 |
| JP | 2008-252055 A | 10/2008 |

\* cited by examiner

Prior Art

Prior Art

SEMICONDUCTOR DEVICE AND METHOD FOR PRODUCING SAME

CROSS-REFERENCES TO RELATED APPLICATIONS

The present application is a Continuation Application of PCT International Application No. PCT/JP2014/062785 filed May 14, 2014, and claiming priority from Japanese Application No. 2013-filed Jun. 10, 2013, the disclosure of which is incorporated herein.

TECHNICAL FIELD

The present invention relates to a semiconductor device having a terminal structure that strengthens the fixation of a terminal of an insertion-type case and enables strong wire bonding, and a method for manufacturing the semiconductor device.

BACKGROUND ART

FIG. 26 is a schematic diagram illustrating the structure of a power semiconductor module.

A power semiconductor module 50 includes a frame 51 which is made of a polyphenylene sulfide (PPS) resin and a terminal 53 that passes through the frame 51 and is buried in a first step portion 52 of the frame 51. The power semiconductor module 50 further includes a second step portion 54 which is formed in the rear surface of the frame 51 and a circuit board 56 which is fitted to the second step portion 54 and is fixed by an adhesive resin 55. The power semiconductor module 50 further includes a semiconductor chip 57 which is soldered to the circuit board 56, a wire 58 which connects the semiconductor chip 57 and the terminal 53 using ultrasonic bonding, and a sealing material 59 which is filled in the frame 51. The circuit board 56 includes a metal plate 56c which is made of, for example, aluminum, an insulating plate 56b which is made of, for example, an epoxy resin and covers the metal plate 56c, and a circuit plate 56a which is formed on the insulating plate 56b.

The surface of the first step portion 52 of the frame 51 is flush with the surface of the terminal 53. The terminal 53 is formed by cutting off an unnecessary portion of a lead frame. The frame 51 functions as the resin case. In addition, the terminal 53 is fixed to the frame 51 by integral molding.

FIG. 27 is a diagram illustrating only the frame and the terminal in the enlarged view of FIG. 26 illustrating a portion B.

The adhesion between the rear surface 53a of the terminal 53 which is integrally molded and the bottom 52a of a buried portion of the first step portion 52 in the frame 51 is low. In addition, in some cases, as illustrated in FIG. 27, the terminal 53 buried in the first step portion 52 comes off the bottom 52a of the buried portion of the first step portion 52 due to the difference between the thermal expansion coefficients of the terminal 53 and the first step portion 52. In this state, during wire bonding, ultrasonic vibration is not effectively transmitted to the terminal 53, which makes it difficult to perform strong wire bonding. As a result, the wire 58 peels off from the terminal 53.

As a method for solving this problem, Patent Document 1 discloses a technique in which a terminal with an inverted T-shaped cross-sectional structure is buried in a case, and a case member fastens and fixes the terminal.

Patent Document 2 discloses a technique in which a protruding portion is provided in a case and is pressed against a terminal from the upper side to fix the terminal.

Patent Document 3 discloses a technique in which a pin is inserted into a through hole that is provided in a portion of the rear surface of a case below a terminal and lifts and fixes the terminal.

Patent Document 4 discloses a technique in which a terminal is bonded to an anchor plate and the anchor plate is fixed to a case. The anchor plate and the case are made of the same material and the surfaces of the anchor plate and the case are melted so that the anchor plate and the case are integrated with each other. In this way, the terminal is firmly fixed.

CITATION LIST

Patent Document

Patent Document 1: JP 9-270441 A
Patent Document 2: JP 2000-332179 A
Patent Document 3: JP 2004-134518 A
Patent Document 4: JP 2000-216187 A

DISCLOSURE OF THE INVENTION

Problem to be Solved by the Invention

However, in Patent Document 1, since the fixed portion of the terminal is wide, it is difficult to reduce the size of the power semiconductor module.

In Patent Document 2, the protruding portion of the case is pressed from the upper side. However, the gap remains between the bottom of the terminal and the case. Therefore, in some cases, it is difficult to sufficiently ensure the adhesion between the terminal and the case.

In Patent Document 3, a component with a complicated shape is required. Therefore, the technique is not suitable for mass production and production costs increase.

In Patent Document 4, it is necessary to add a process of bonding the anchor plate to the terminal with an adhesive and a process of hardening the adhesive before the case and the terminal are integrally molded. As a result, production costs increase.

The invention has been made in order to solve the above-mentioned problems and an object of the invention is to provide a semiconductor device which enables strong wire bonding and has high mass productivity, a small size, and low production costs, and a method for producing the same.

Means for Solving Problem

In order to achieve the object, according to an aspect of the invention, there is provided a semiconductor device including: a frame comprising a first step portion that is provided in a ring shape in an inner circumference of one main surface, a second step portion that is provided in a ring shape in an inner circumference of the other main surface, and an inner wall that is provided between the first step portion and the second step portion; a terminal that leads from the first step portion to the outside; a circuit board that is fitted to the second step portion; and an adhesive resin that bonds the second step portion and the circuit board and contacts the inner wall and the terminal.

According to another aspect of the invention, there is provided a semiconductor device including: a frame comprising a first step portion that is provided in a ring shape in an inner circumference of one main surface, a second step portion that is provided in a ring shape in an inner circumference of the other main surface, an inner wall that is provided between the first step portion and the second step portion, and a through hole that passes through the first step portion and the second step portion; a terminal that leads from the first step portion to the outside; a circuit board that is fitted to the second step portion; and an adhesive resin that bonds the second step portion and the circuit board, is filled in the through hole, and contacts the terminal.

According to still another aspect of the invention, there is provided a semiconductor device including: a frame comprising a first step portion that is provided in a ring shape in an inner circumference of one main surface, a second step portion that is provided in a ring shape in an inner circumference of the other main surface, and an inner wall that is provided between the first step portion and the second step portion; a terminal that leads from the first step portion to the outside; a circuit board that is fitted to the second step portion; and a first adhesive resin that bonds the second step portion and the circuit board. The frame includes a void that is formed in the first step portion at a position corresponding to a side of the terminal. A second adhesive resin is arranged in the void.

According to yet another aspect of the invention, there is provided a method for producing a semiconductor device including: a step of preparing a frame including a first step portion that is provided in a ring shape in an inner circumference of one main surface, a terminal that is fixed to the first step portion, a second step portion that is provided in a ring shape in an inner circumference of the other main surface, and an inner wall that is provided between the first step portion and the second step portion; a step of preparing a circuit board; a step of applying an adhesive resin onto the second step portion, with the one main surface of the frame facing downward; and a step of fitting the circuit board to the second step portion to press the adhesive resin and applying the adhesive resin onto the inner wall and the terminal.

According to still yet another aspect of the invention, there is provided a method for producing a semiconductor device including: a step of preparing a frame including a first step portion that is provided in a ring shape in an inner circumference of one main surface, a terminal that is fixed to the first step portion, a second step portion that is provided in a ring shape in an inner circumference of the other main surface, and an inner wall that is provided between the first step portion and the second step portion; a step of preparing a circuit board; a step of applying a first adhesive resin onto the second step portion, with the one main surface of the frame facing downward; a step of fitting the circuit board to the second step portion; and a step of applying a second adhesive resin onto the inner wall and the terminal, with the one main surface of the frame facing upward.

According to yet still another aspect of the invention, there is provided a method for producing a semiconductor device including: a step of preparing a frame including a first step portion that is provided in a ring shape in an inner circumference of one main surface, a terminal that is fixed to the first step portion, a second step portion that is provided in a ring shape in an inner circumference of the other main surface, an inner wall that is provided between the first step portion and the second step portion, and a through hole that passes through the first step portion and the second step portion; a step of preparing a circuit board; a step of applying an adhesive resin onto the second step portion, with the one main surface of the frame facing downward, and filling the through hole with the adhesive resin; and a step of fitting the circuit board to the second step portion.

Effect of the Invention

In the invention, the terminal and the frame are fixed to each other by the adhesive resin. Therefore, it is possible to provide a semiconductor device which enables strong wire bonding and has high mass productivity, a small size, and low production costs, and a method for producing the same.

The above and other objects, features, and advantages of the invention will be apparent from the following description taken in conjunction with the accompanying drawings illustrating preferred embodiments as examples of the invention.

EMBODIMENTS FOR CARRYING OUT THE INVENTION

Figure 1A:
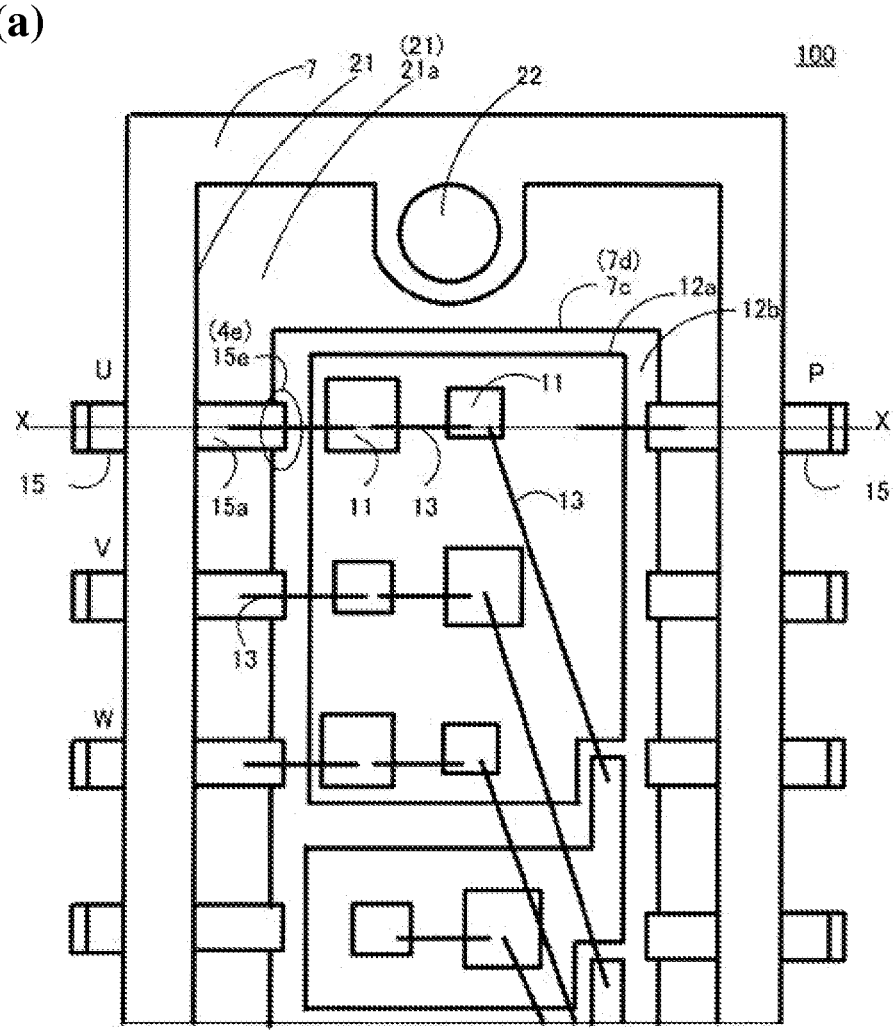
FIGS. 1(a), 1(b) are diagrams illustrating a main portion of the structure of a semiconductor device according to a first embodiment (part 1)
Figure 1B:
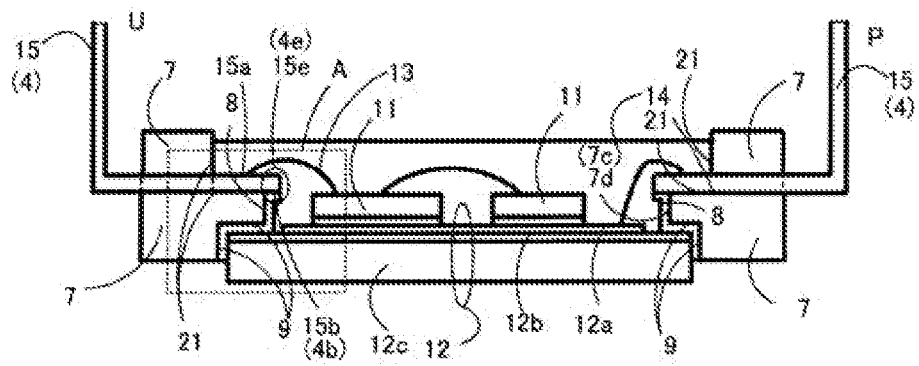

Hereinafter, embodiments will be described using the following examples.

First Embodiment

FIGS. 1(a) to 4 are diagrams illustrating a main portion of the structure of a semiconductor device according to a first embodiment.

A semiconductor device 100 includes a frame 7, terminals 15, a circuit board 12, and an adhesive resin 8. The frame 7 is made of, for example, a PPS resin and corresponds to a resin case of the semiconductor device 100. In addition, the frame 7 includes a first step portion 21 which is provided in a ring shape in the inner circumference of one main surface (an upper surface in the drawings), a second step portion 9 which is provided in a ring shape in the inner circumference of the other main surface (a lower surface in the drawings), and an inner wall 7d which is provided between the first step portion 21 and the second step portion 9.

The terminal 15 is buried in the frame 7 such that it passes through the frame 7 and a front surface 4a is exposed from a front surface 21a of the first step portion 21. In addition, the terminal 15 includes a protruding portion 15e whose leading end protrudes, for example, about 1 mm from the inner wall 7d of the frame 7.

The circuit board 12 is fitted to the second step portion 9 of the frame 7. The circuit board 12 includes a metal plate 12c which is made of, for example, aluminum, an insulating plate 12b which is made of, for example, an epoxy resin and covers the metal plate 12c, and a circuit plate 12a which is formed on the surface of the insulating plate 12b. For example, a direct copper bonding (DCB) board may be used as the circuit board 12.

The adhesive resin 8 bonds the circuit board 12 to the second step portion 9 of the frame 7 and is arranged to contact the inner wall 7d of the frame 7 and the terminal 15.

In addition, the semiconductor device 100 includes semiconductor chips 11, wires 13, and a sealing material 14. The semiconductor chip 11 is soldered to the circuit plate 12a of the circuit board 12. The wire 13 is made of, for example, aluminum or copper and electrically connects the semiconductor chip 11 and the terminal 15. The sealing material 14 is filled in the frame 7 and seals the inside of the semiconductor device 100. In addition, attachment holes 22 are provided in the frame 7.

In this embodiment, the adhesive resin 8 contacts a rear surface 15b of the protruding portion 15e of the terminal 15 and the inner wall 7d of the frame 7 and the terminal 15 and the frame 7 are firmly fixed to each other by the adhesive resin 8. Therefore, strong wire bonding using ultrasonic vibration can be performed on the terminal 15.

Figure 4:
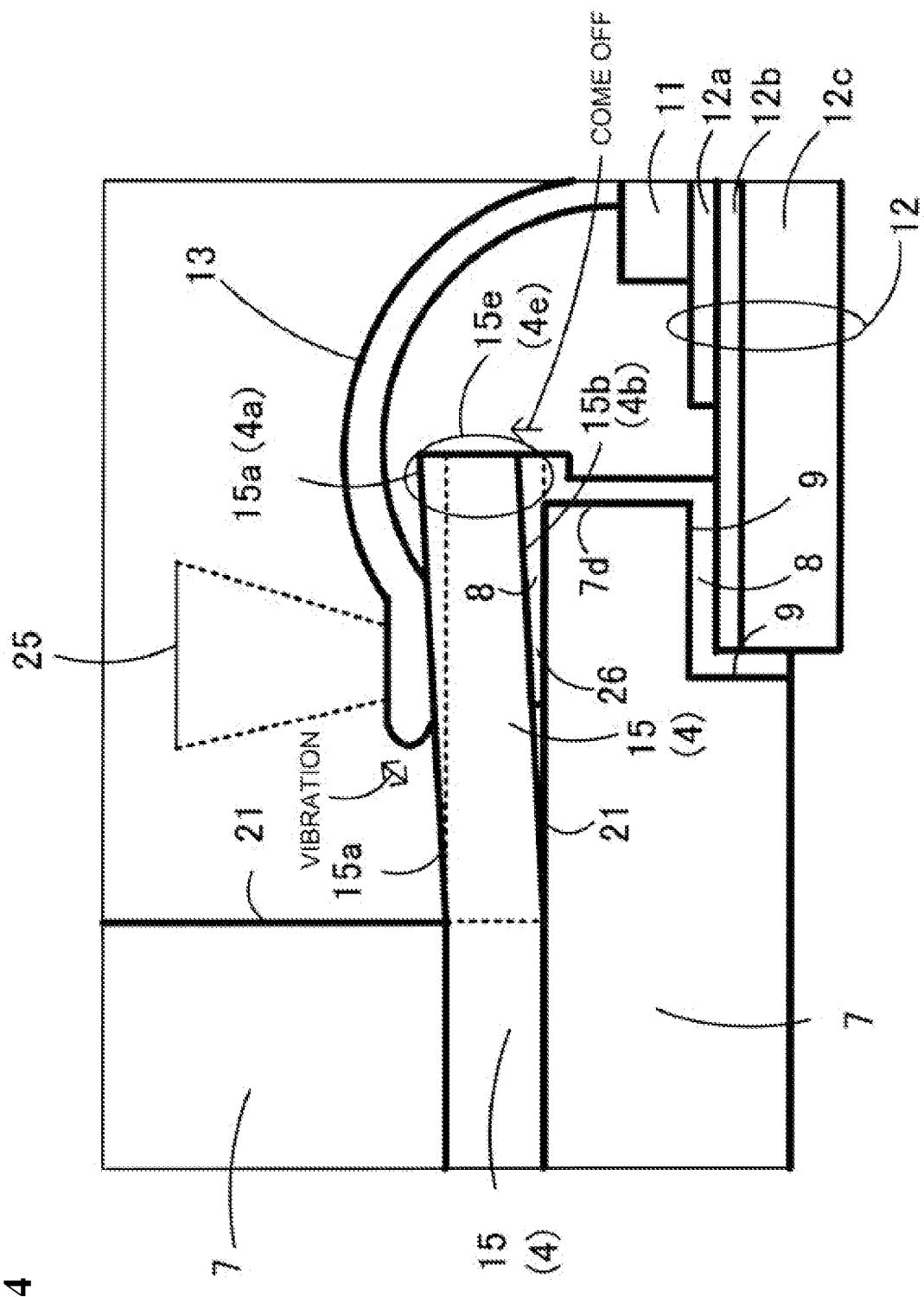
FIG. 4 is a diagram illustrating the main portion of the structure of the semiconductor device according to the first embodiment (part 4)

In particular, FIG. 4 illustrates a case in which the terminal comes off a buried position of the first step portion. As illustrated in FIG. 4, even when the terminal 15 buried in the first step portion 21 comes off the buried portion due to a difference between thermal expansion coefficients and a gap 26 is generated, the adhesive resin 8 can flow into the gap 26 and can be solidified. Therefore, the terminal 15 and the first step portion 21 (frame 7) are firmly fixed to each other by the adhesive resin 8 and it is possible to perform strong wire bonding using an ultrasonic bonding device 25. Specifically, when bonding strength is represented by shear strength, shear strength is equal to or greater than 100 g (=0.1×9.8 N) and it is possible to ensure sufficient reliability. The shear strength was improved by 140% or more under the condition that force parallel to the surface of the terminal 15 was applied to a bonding portion and a bonding surface did not peel off, as compared to a case in which the adhesive resin 8 was not provided. Vibration indicated by an arrow in FIG. 4 indicates the direction of the ultrasonic vibration.

Since the terminal 15 and the frame 7 can be fixed to each other by the adhesive resin 8 for fixing the circuit board 12, an additional process is not required and it is possible to firmly fix the terminal 15 to the first step portion 21 at low costs.

The fixing position of the terminal 15 does not need to be wide, unlike Patent Document 1. Therefore, it is possible to reduce the size of the semiconductor device 100.

The adhesive resin 8 is made of a material with an elastic coefficient capable of absorbing vibration and is preferably a thermosetting resin which is in a liquid state, has low viscosity, and can be treated at room temperature. The adhesive resin 8 may be, for example, any one of an epoxy-based resin, a polyimide-based resin, a polyamide-based resin, or a silicone-based resin.

When the adhesive resin 8 is applied, it is applied while vacuuming is performed. Therefore, it is possible to fill the gap 26 with the adhesive resin 8 with high efficiency.

Example 2

Figure 5A:
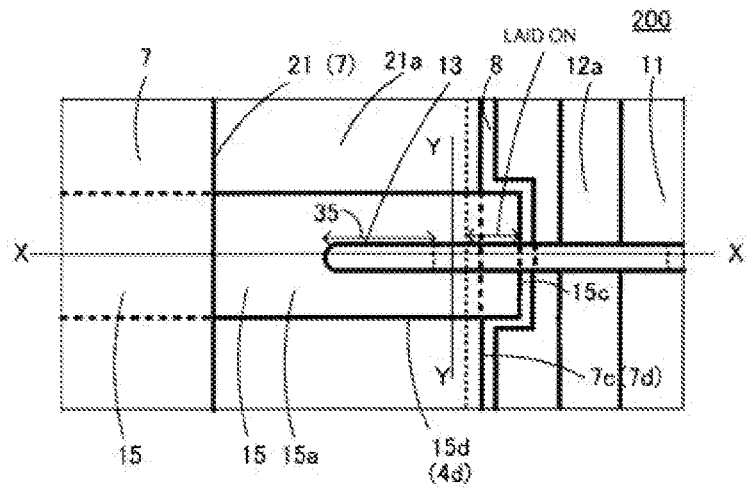
FIGS. 5(a)-5(c) are diagrams illustrating a main portion of the structure of a semiconductor device according to a second embodiment.
Figure 5B:
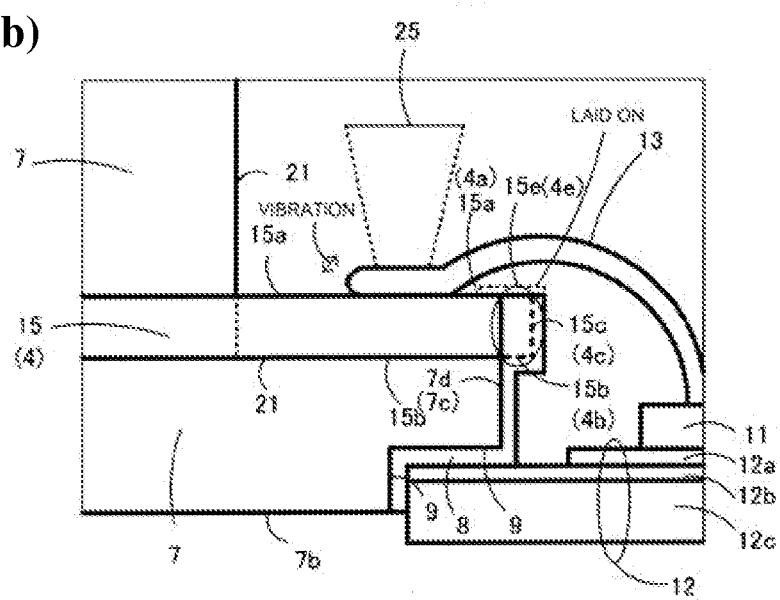
Figure 5C:
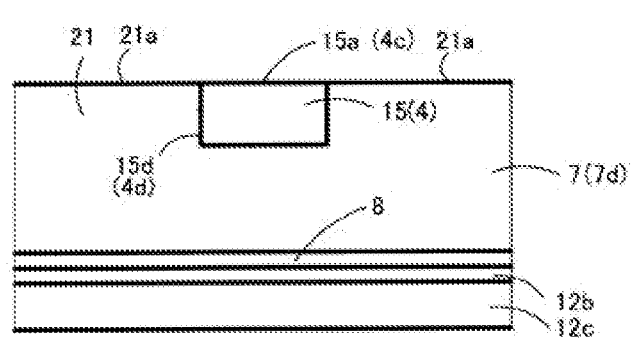

FIGS. 5(a)-5(c) are diagrams illustrating a main portion of the structure of a semiconductor device according to a second embodiment. FIGS. 5(a)-5(c) correspond to FIGS. 2(a)-2(c), which show the first embodiment.

Figure 2A:
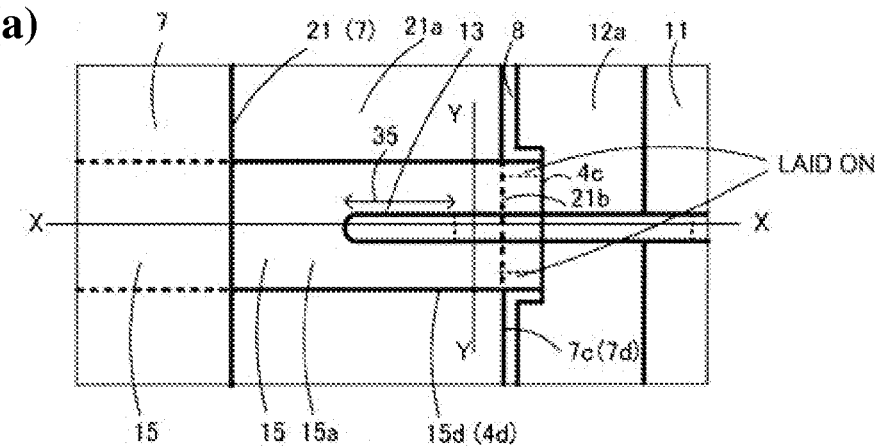
FIGS. 2(a)-2(c) are diagrams illustrating the main portion of the structure of the semiconductor device according to the first embodiment (part 2)
Figure 2B:
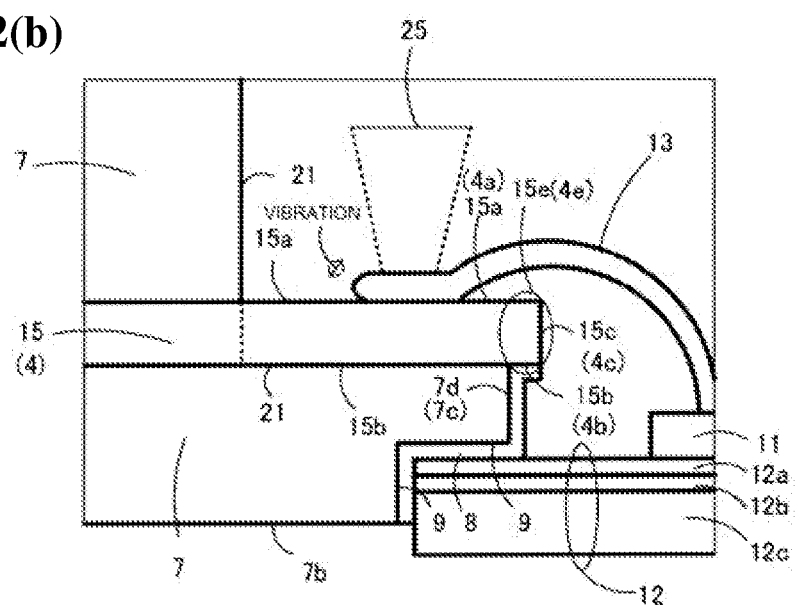
Figure 2C:
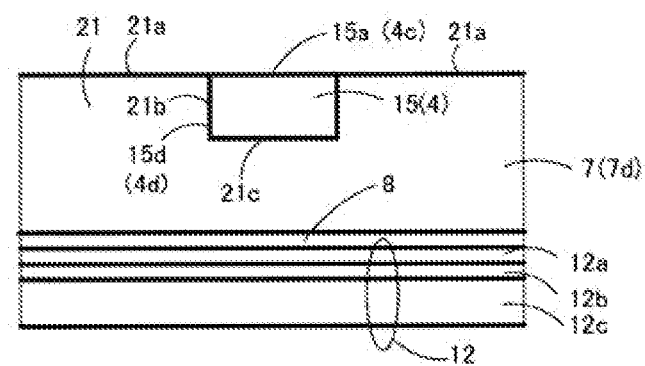
Figure 3A:
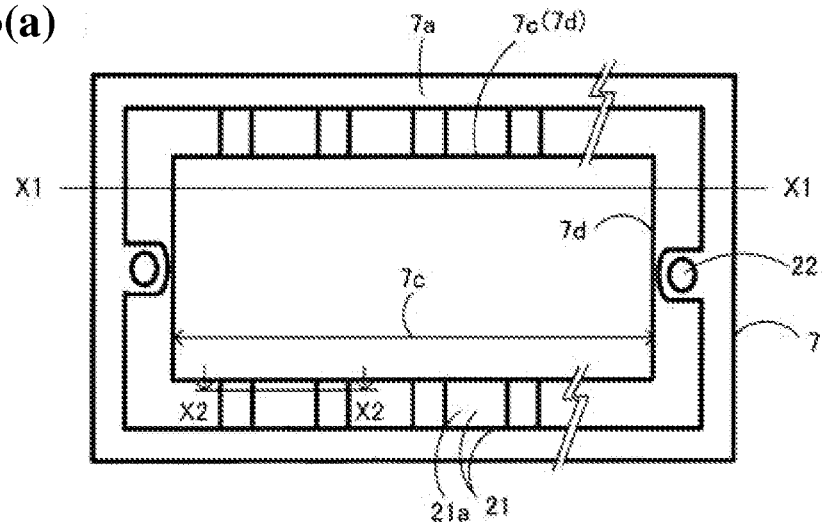
FIGS. 3(a)-3(d) are diagrams illustrating the main portion of the structure of the semiconductor device according to the first embodiment (part 3)
Figure 3B:
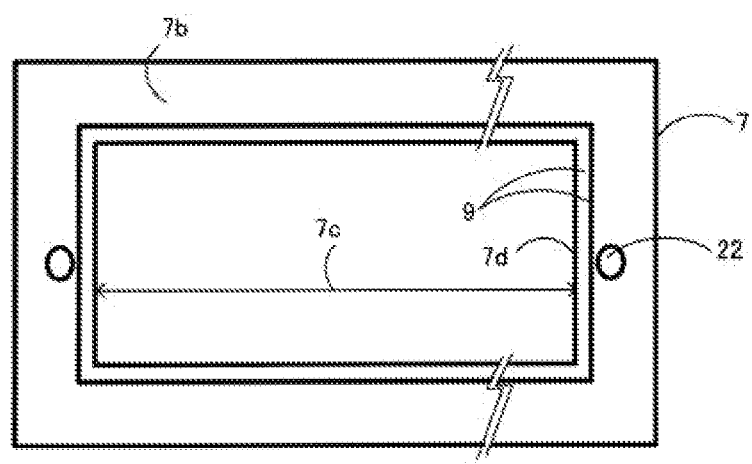
Figure 3C:
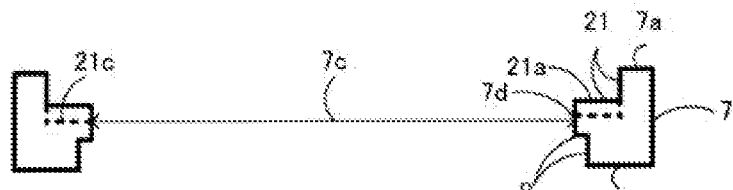
Figure 3D:
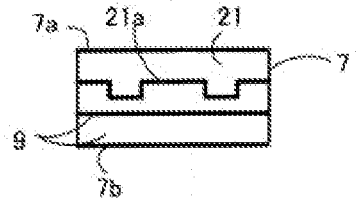

A semiconductor device 200 illustrated in FIGS. 5(a)-5(c) differs from the semiconductor device 100 illustrated in FIGS. 2(a)-2(c) in that the adhesive resin 8 also contacts the end surface 15c of the protruding portion 15e of the terminal 15. Since both the rear surface 15b and the end surface 15c and the protruding portion 15e of the terminal 15 are bonded to the frame 7, as compared to the first embodiment, it is possible to further firmly fix the terminal 15.

However, the adhesive resin 8 may protrude at any position other than a bonding position 35 on the front surface 15a of the terminal 15.

Third Embodiment

Figure 6A:
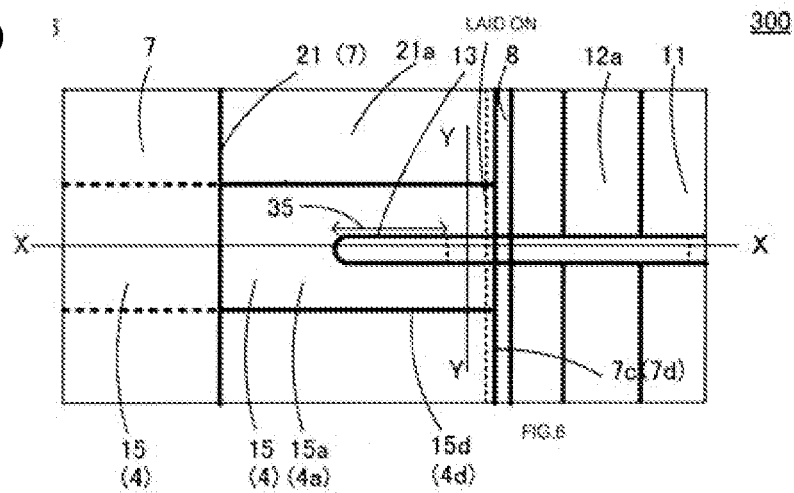
FIGS. 6(a)-6(c) are diagrams illustrating a main portion of the structure of a semiconductor device according to a third embodiment.
Figure 6B:
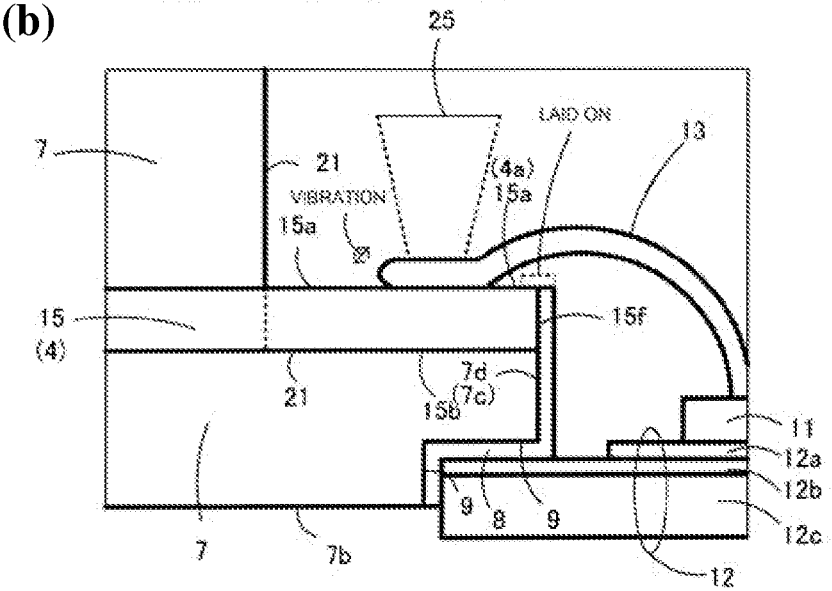
Figure 6C:
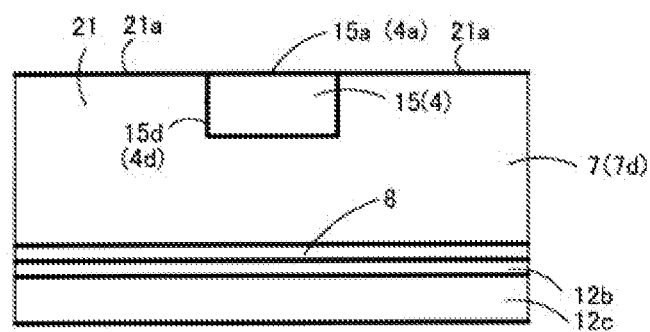

FIGS. 6(a)-6(c) are diagrams illustrating a main portion of the structure of a semiconductor device according to a third embodiment. FIGS. 6(a)-6(c) correspond to FIGS. 5(a)-5(c), which show the second embodiment.

A semiconductor device 300 illustrated in FIGS. 6(a)-6(c) differs from the semiconductor device 200 illustrated in FIGS. 5(a)-5(c) in that the protruding portion 15e of the terminal 15 is not provided, and the inner wall 7d of the frame 7 is substantially flush with an end surface 15f of the terminal 15 (for example, a difference in level is equal to or less than 0.1 mm). In this case, the end surface 15f of the terminal 15 and the inner wall 7d of the frame 7 are firmly fixed to each other by the adhesive resin 8. Therefore, it is possible to perform strong wire bonding using ultrasonic vibration.

Fourth Embodiment

Figure 7A:
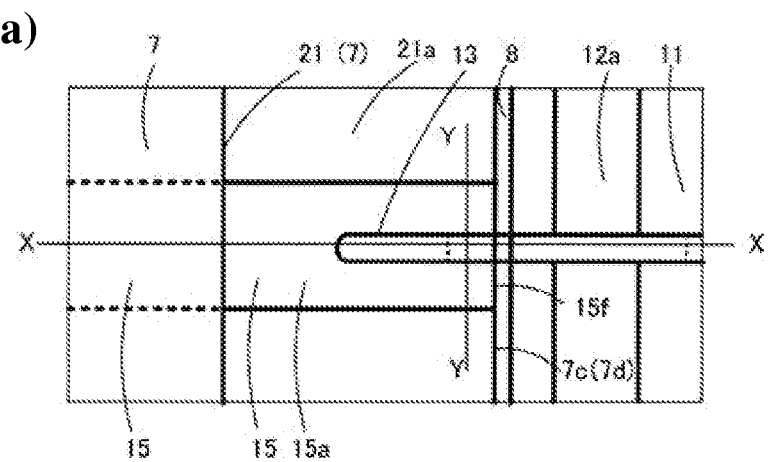
FIGS. 7(a)-7(c) are diagrams illustrating a main portion of the structure of a semiconductor device according to a fourth embodiment.
Figure 7B:
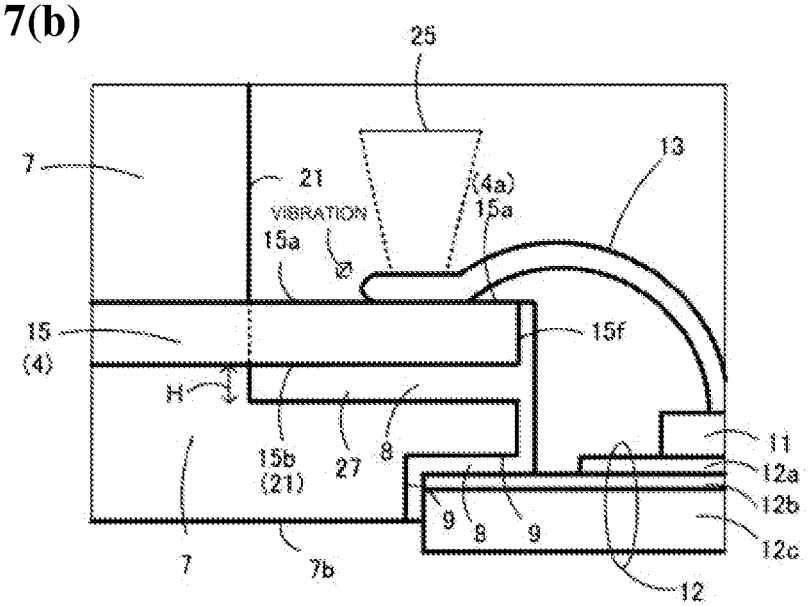
Figure 7C:
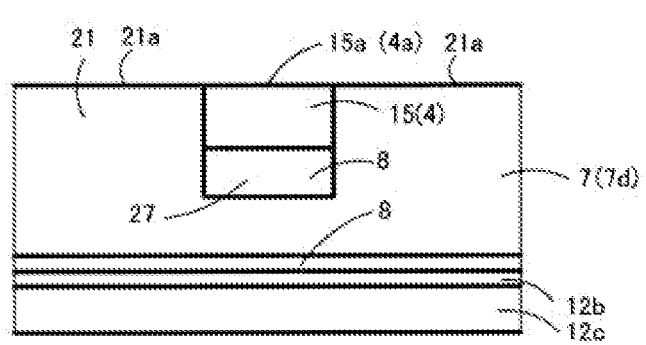

FIGS. 7(a)-7(c) are diagrams illustrating a main portion of the structure of a semiconductor device according to a fourth embodiment. FIGS. 7(a)-7(c) correspond to FIGS. 6(a)-6(c), which show the third embodiment.

A semiconductor device 400 illustrated in FIGS. 7(a)-7(c) differs from the semiconductor device 300 illustrated in FIGS. 6(a)-6(c) in that a void 27 is provided in a portion of the first step portion 21 below the rear surface 15b of the terminal 15 and is filled with the adhesive resin 8 to fix the terminal 15. The height H of the void 27 may be in the range of about 0.2 mm to 1 mm. In this case, it is possible to firmly fix the terminal 15 and the first step portion 21 and good ultrasonic bonding is performed. When the void 27 is provided in the semiconductor device 100, 200, or 300, the fixation strength between the terminal 15 and the first step portion 21 is further improved.

Fifth Embodiment

Figure 8A:
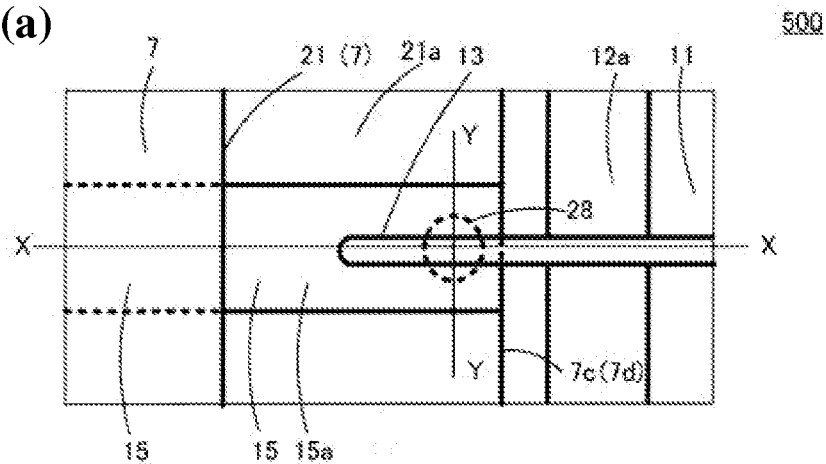
FIGS. 8(a)-8(c) are diagrams illustrating a main portion of the structure of a semiconductor device according to a fifth embodiment.
Figure 8B:
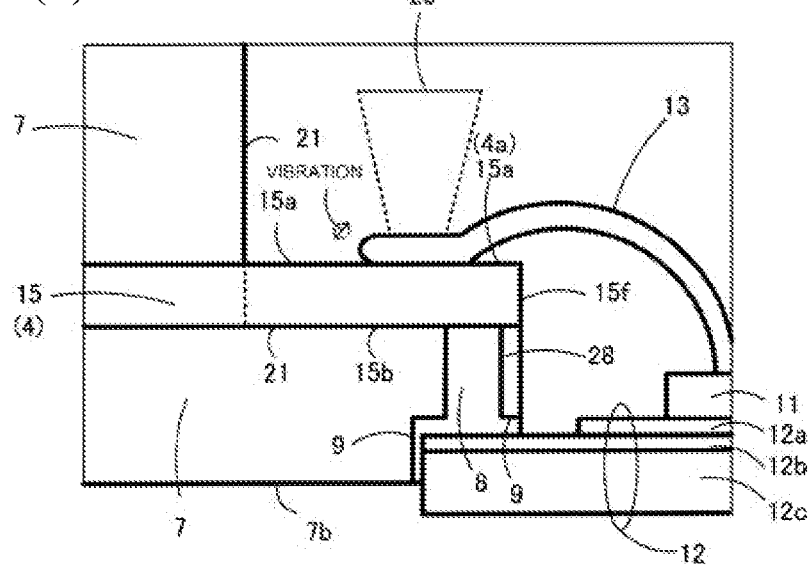
Figure 8C:
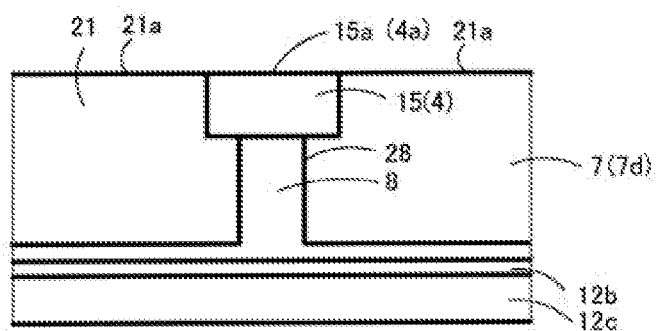

FIGS. 8(a)-8(c) are diagrams illustrating a main portion of the structure of a semiconductor device according to a fifth embodiment. FIGS. 8(a)-8(c) correspond to FIGS. 7(a)-7(c), which show the fourth embodiment.

A semiconductor device 500 illustrated in FIGS. 8(a)-8(c) differs from the semiconductor device 300 illustrated in FIGS. 6(a)-6(c) in that a through hole 28 is provided between the second step portion 9 and the first step portion 21 and is filled with the adhesive resin 8, and the adhesive resin 8 contacts the terminal 15 to fix the terminal 15. In this case, the terminal 15 and the first step portion 21 are firmly fixed to each other and good ultrasonic bonding is performed.

Sixth Embodiment

Figure 9A:
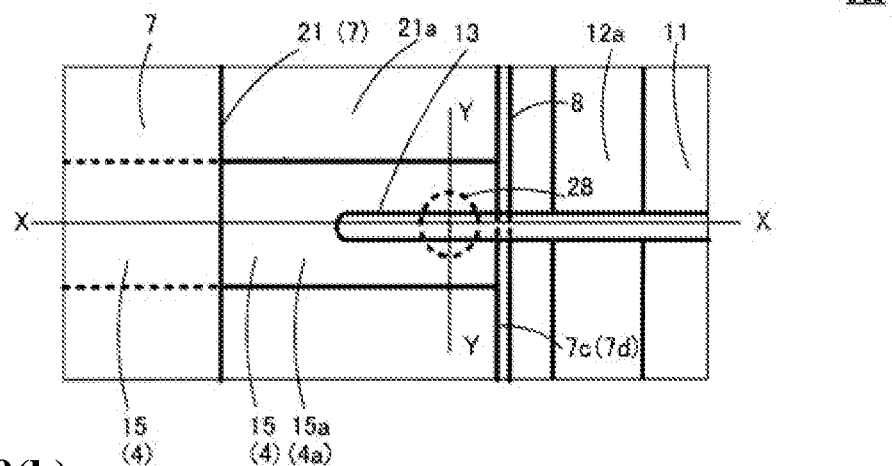
FIGS. 9(a)-9(c) are diagrams illustrating a main portion of the structure of a semiconductor device according to a sixth embodiment.
Figure 9B:
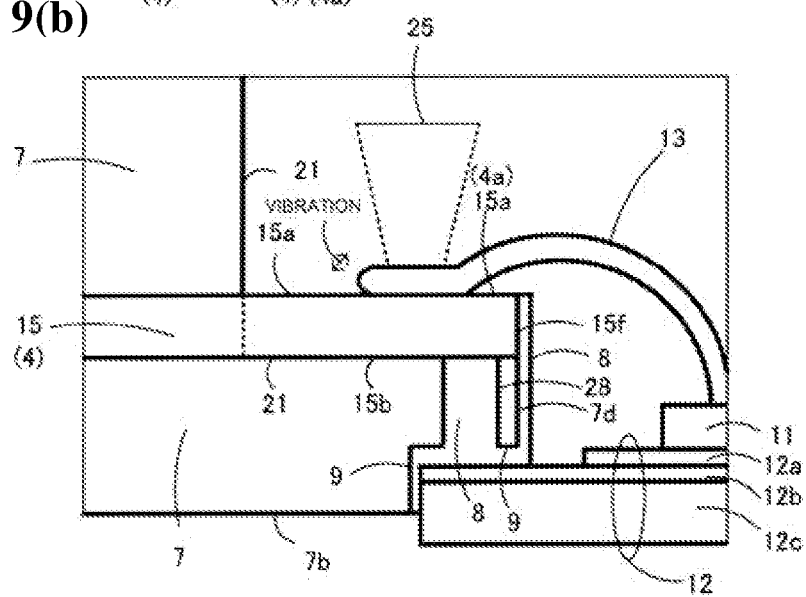
Figure 9C:
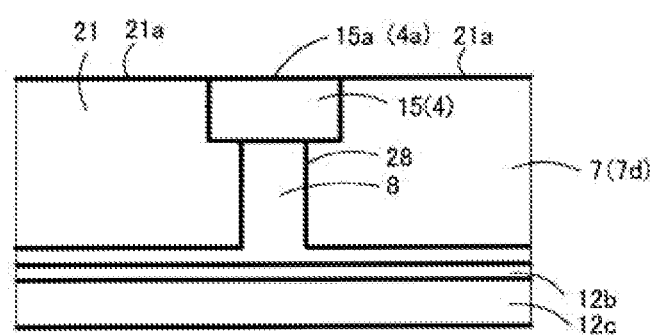

FIGS. 9(a)-9(c) are diagrams illustrating a main portion of the structure of a semiconductor device according to a sixth embodiment. FIGS. 9(a)-9(c) correspond to FIGS. 8(a)-8(c), which show the fifth embodiment.

A semiconductor device 600 illustrated in FIGS. 9(a)-9(c) differs from the semiconductor device 500 illustrated in FIGS. 8(a)-8(c) in that the adhesive resin 8 contacts both the end surface 15f of the terminal 15 and the inner wall 7d of the frame 7. In this case, the terminal 15 and the first step portion 21 are fixed to each other at two positions, that is, the through hole 28 and the end surface 15f. Therefore, fixation strength is more than that in the semiconductor device 500 and good ultrasonic bonding is performed.

Seventh Embodiment

Figure 10A:
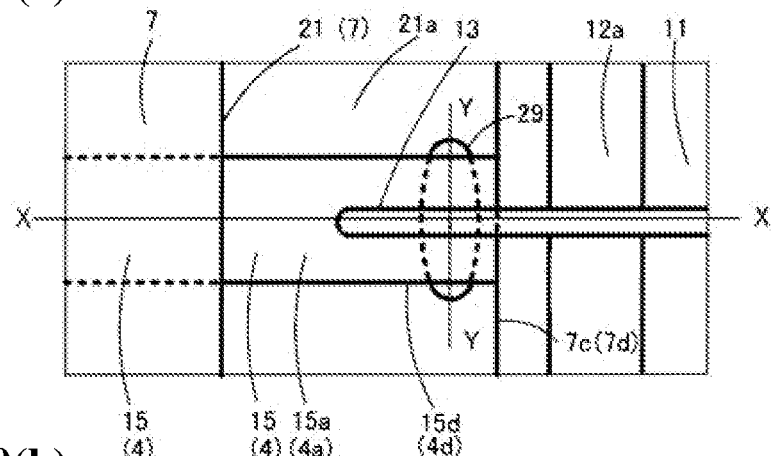
FIGS. 10(a)-10(c) are diagrams illustrating a main portion of the structure of a semiconductor device according to a seventh embodiment.
Figure 10B:
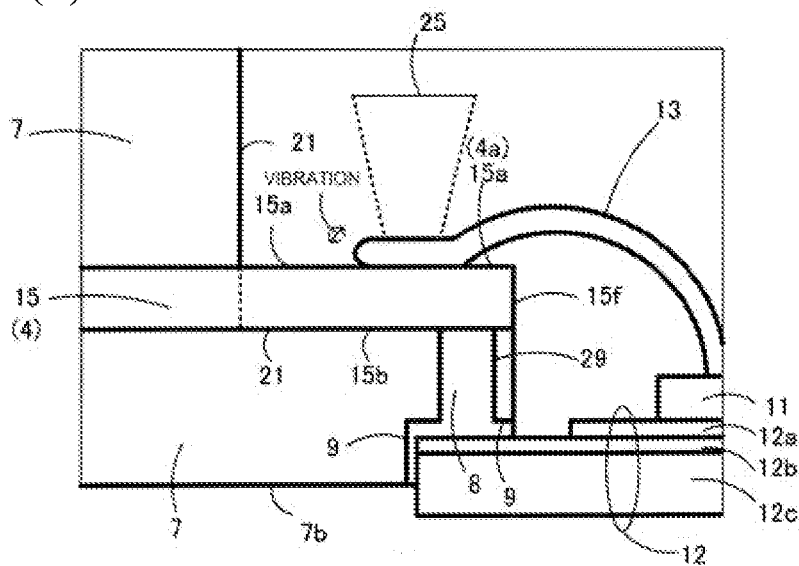
Figure 10C:
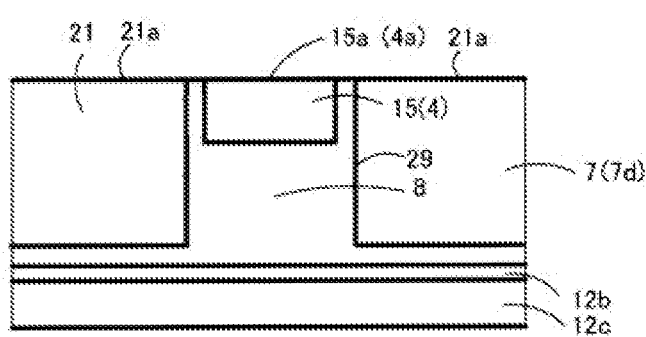

FIGS. 10(a)-10(c) are diagrams illustrating a main portion of the structure of a semiconductor device according to a seventh embodiment. FIGS. 10(a)-10(c) correspond to FIGS. 8(a)-8(c), which show the fifth embodiment.

A semiconductor device 700 illustrated in FIGS. 10(a)-10(c) differs from the semiconductor device 500 illustrated in FIGS. 8(a)-8(c) in that the width of the through hole 29 is larger than that of the terminal 15. In this case, since the adhesive resin 8 also contacts a side surface 15d of the terminal 15, the fixation strength between the terminal 15 and the first step portion 21 can be more than that in the semiconductor device 500.

Eighth Embodiment

Figure 11A:
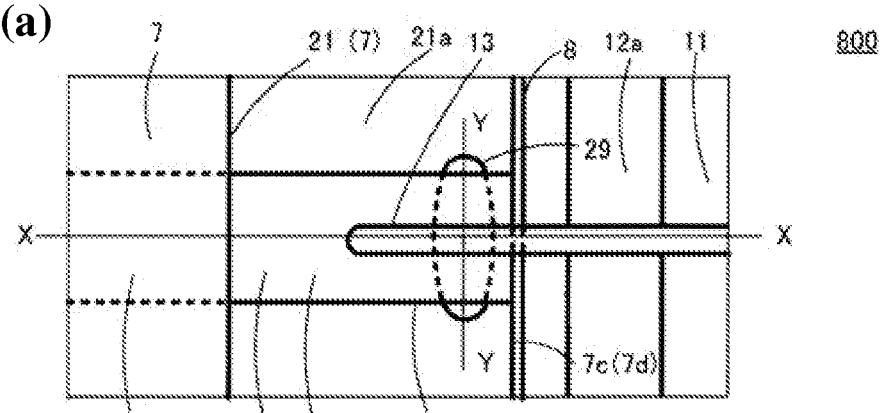
FIGS. 11(a)-11(c) are diagrams illustrating a main portion of the structure of a semiconductor device according to an eighth embodiment.
Figure 11B:
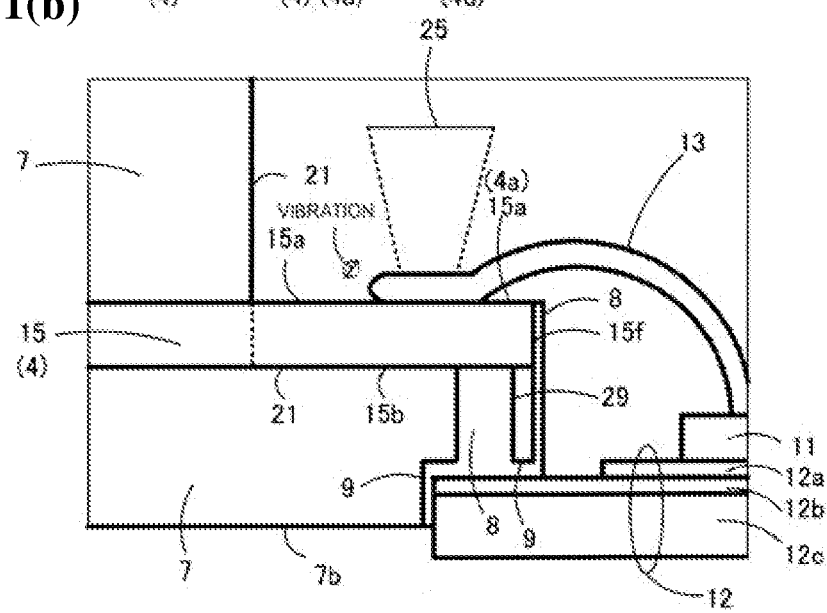
Figure 11C:
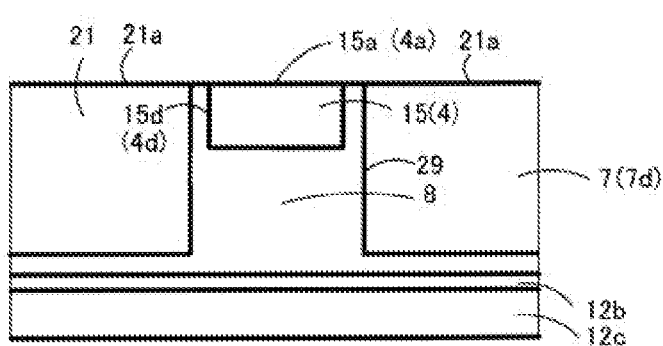

FIGS. 11(a)-11(c) are diagrams illustrating a main portion of the structure of a semiconductor device according to an eighth embodiment. FIGS. 11(a)-11(c) correspond to FIGS. 10(a)-10(c), which show the seventh embodiment.

A semiconductor device 800 illustrated in FIGS. 11(a)-11(c) differs from the semiconductor device 700 illustrated in FIGS. 10(a)-10(c) in that the adhesive resin 8 contacts both the end surface 15f of the terminal 15 and the inner wall 7d of the frame 7. In this case, the terminal 15 and the first step portion 21 are fixed to each other at two positions, that is, the through hole 29 and the end surface 15f. Therefore, fixation strength is more than that in the semiconductor device 700 and good ultrasonic bonding is performed.

Ninth Embodiment

Figure 12A:
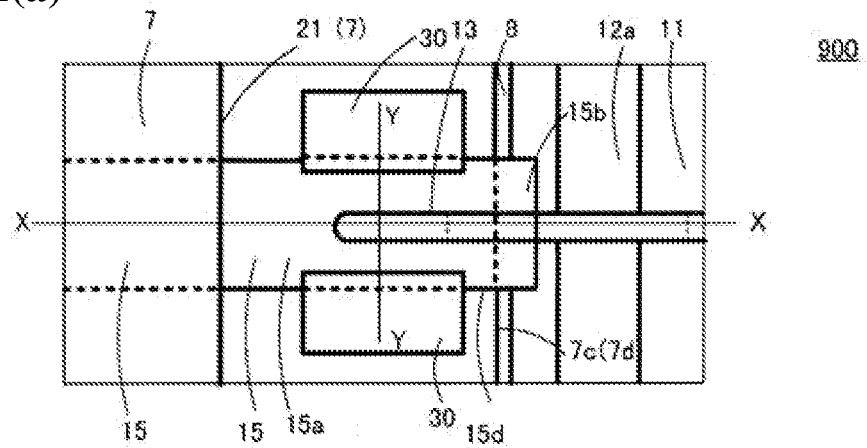
FIGS. 12(a)-12(c) are diagrams illustrating a main portion of the structure of a semiconductor device according to a ninth embodiment.
Figure 12B:
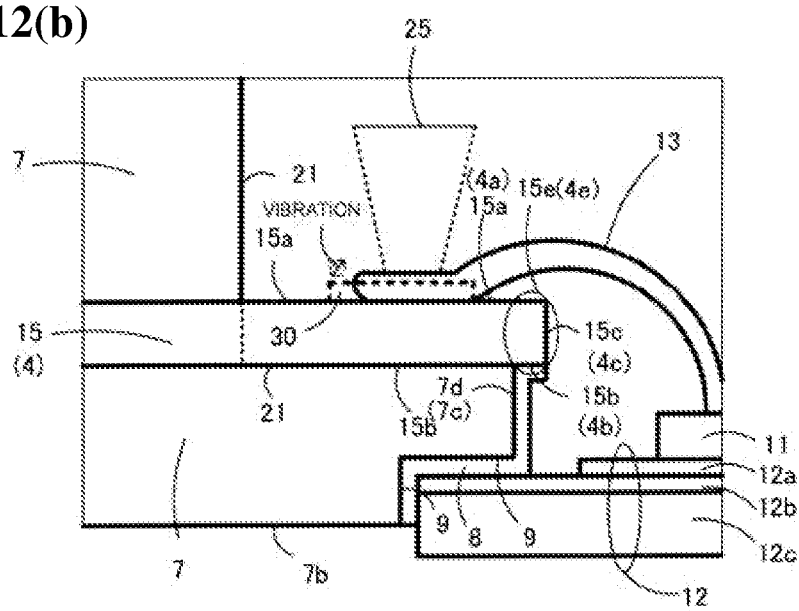
Figure 12C:
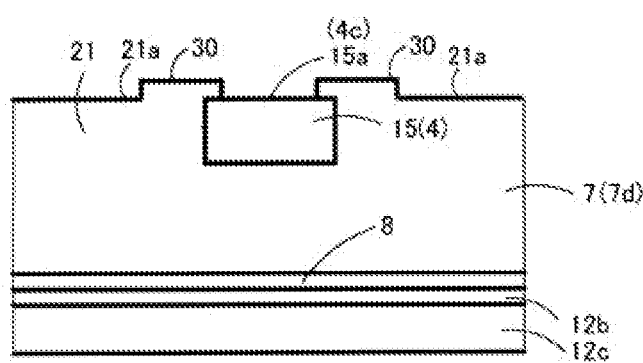

FIGS. 12(a)-12(c) are diagrams illustrating a main portion of the structure of a semiconductor device according to a ninth embodiment. FIGS. 12(a)-12(c) correspond to FIGS. 2(a)-2(c), which, show the first embodiment.

A semiconductor device 900 illustrated in FIGS. 12(a)-12(c) differs from the semiconductor device 100 illustrated in FIGS. 2(a)-2(c) in that a locking portion 30 is provided in the first step portion 21 of the frame 7. The locking portion 30 may be molded integrally with the frame 7 or it may be independently formed of a different material and then attached by an adhesive.

The terminal 15 is pressed from one main surface to the other main surface of the frame 7 using the locking portion 30 to further improve the fixation strength between the terminal 15 and the first step portion 21.

In addition, the locking portion 30 can be provided in the semiconductor devices 200 to 800 to further improve ultrasonic bonding strength.

Tenth Embodiment

Figure 13A:
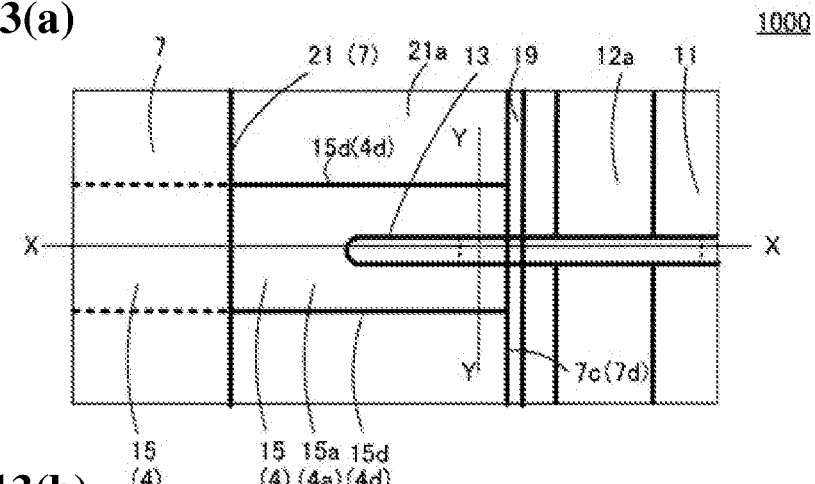
FIGS. 13(a)-13(c) are diagrams illustrating a main portion of the structure of a semiconductor device according to a tenth embodiment.
Figure 13B:
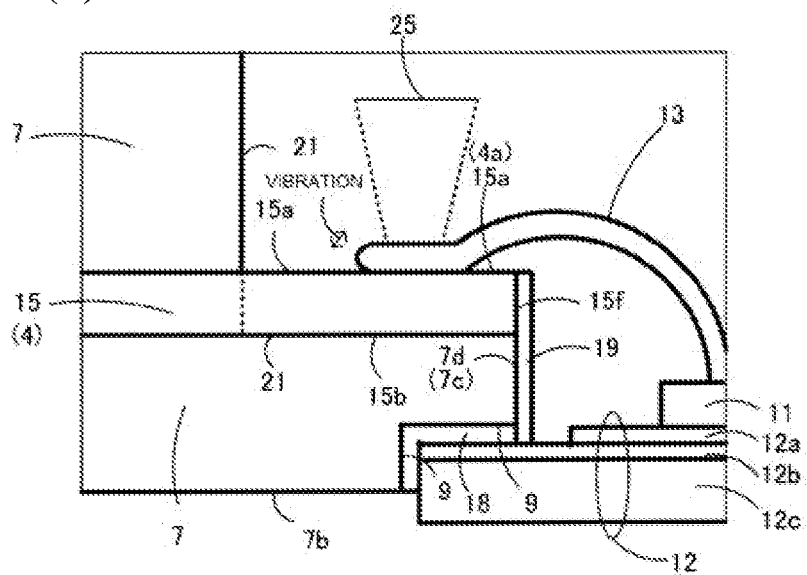
Figure 13C:
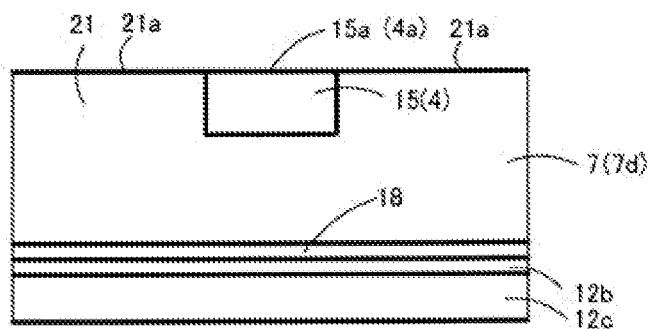

FIGS. 13(a)-13(c) are diagrams illustrating a main portion of the structure of a semiconductor device according to a tenth embodiment. FIGS. 13(a)-13(c) correspond to FIGS. 6(a)-6(c), which show the third embodiment.

A semiconductor device 1000 illustrated in FIGS. 13(a)-13(c) differs from the semiconductor device 300 illustrated in FIGS. 6(a)-6(c) in that an adhesive resin for fixing the end surface 15f of the terminal 15 and the inner wall 7d of the frame 7 is different from an adhesive resin for fixing the circuit board 12 and the second step portion 9. A first adhesive resin 18 is used to fix the circuit board 12 and the second step portion 9 and a second adhesive resin 19 is used to fix the end surface 15f of the terminal 15 and the inner wall 7d of the frame 7. In this case, similarly to the semiconductor device 300, it is possible to firmly fix the terminal 15 and the first step portion 21 and good ultrasonic bonding is performed.

Eleventh Embodiment

Figure 14A:
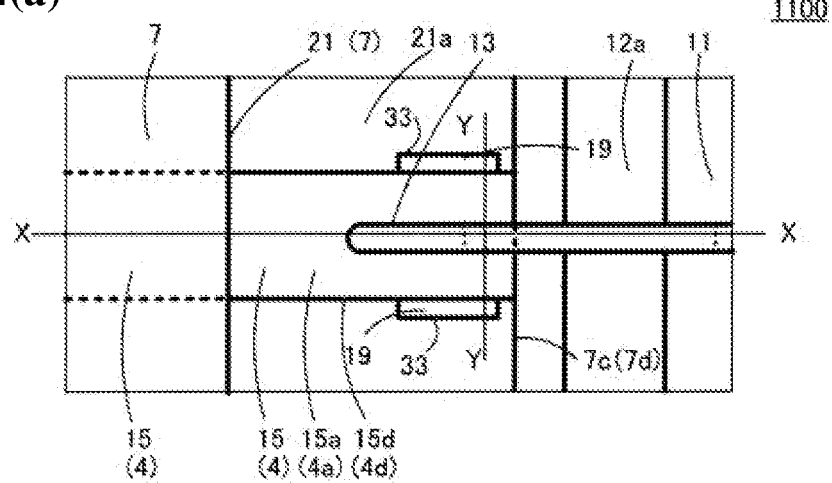
FIGS. 14(a)-14(c) are diagrams illustrating a main portion of the structure of a semiconductor device according to an eleventh embodiment.
Figure 14B:
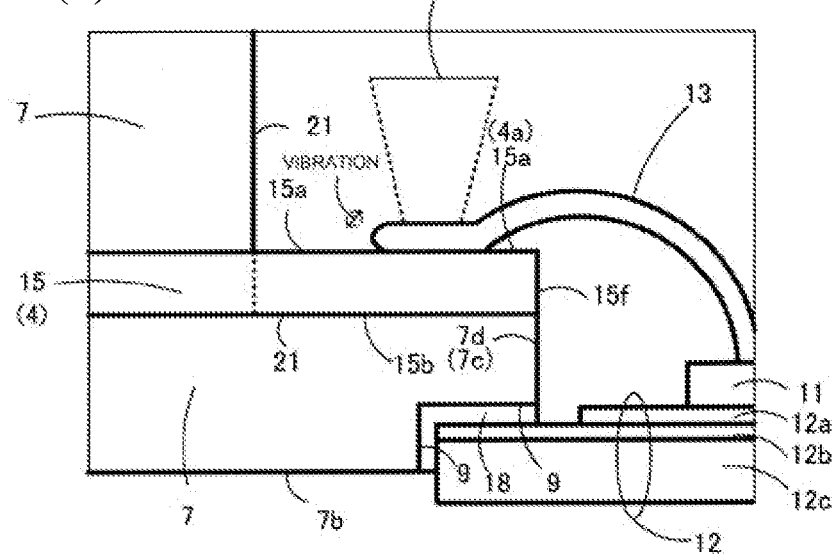
Figure 14C:
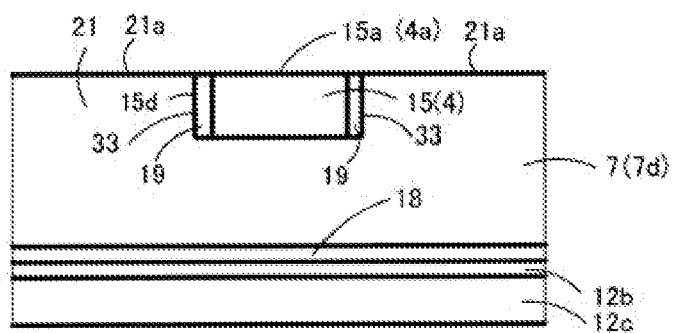

FIGS. 14(a)-14(c) are diagrams illustrating a main portion of the structure of a semiconductor device according to an eleventh embodiment. FIGS. 14(a)-14(c) correspond to FIGS. 13(a)-13(c), which show the tenth embodiment.

A semiconductor device 1100 illustrated in FIGS. 14(a)-14(c) differs from the semiconductor device 1000 illustrated in FIGS. 13(a)-13(c) in that a void 33 is provided in the first step portion 21 which contacts the side surface 15d of the terminal 15 and is filled with the second adhesive resin 19 to fix the first step portion 21 and the side surface 15d of the terminal 15. In this case, the terminal 15 and the first step portion 21 are firmly fixed to each other and good ultrasonic bonding is performed.

As in the semiconductor device 1000, since the adhesive resin is applied onto the end surface 15f of the terminal 15 and the inner wall 7d of the frame 7, it is possible to further improve fixation strength.

Twelfth Embodiment

Figure 15A:
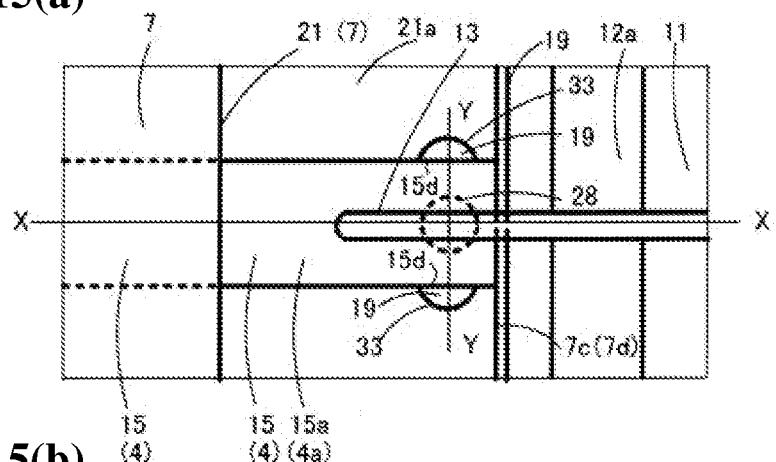
FIGS. 15(a)-15(c) are diagrams illustrating a main portion of the structure of a semiconductor device according to a twelfth embodiment.
Figure 15B:
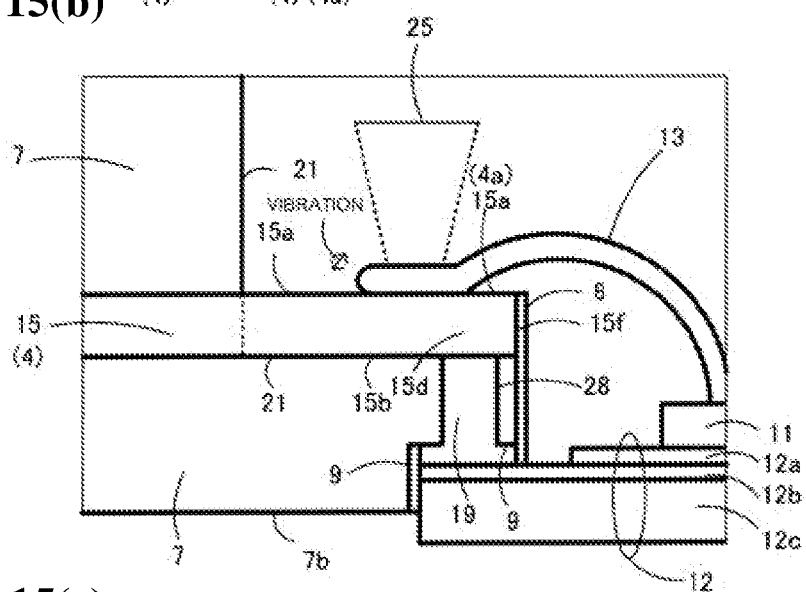
Figure 15C:
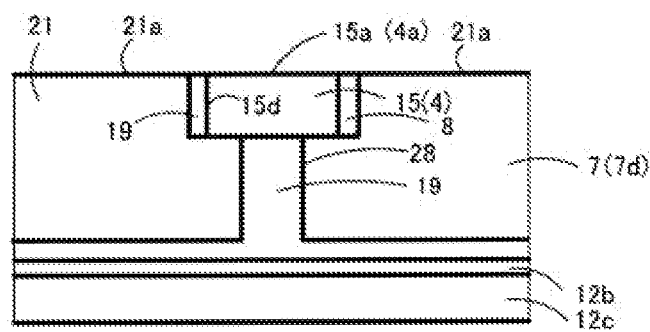

FIGS. 15(a)-15(c) are diagrams illustrating a main portion of the structure of a semiconductor device according to a twelfth embodiment. FIGS. 15(a)-15(c) correspond to FIGS. 8(a)-8(c), which show the fifth embodiment.

A semiconductor device 1200 illustrated in FIGS. 15(a)-15(c) differs from the semiconductor device 500 illustrated in FIGS. 8(a)-8(c) in that a void 33 is provided in the first step portion 21 which contacts the side surface 15d of the terminal 15 and is filled with the second adhesive resin 19 to fix the first step portion 21 and the side surface 15d of the terminal 15. In this case, the fixation strength between the terminal 15 and the first step portion 21 is further improved and good ultrasonic bonding is performed.

Thirteenth Embodiment

FIGS. 16(a) to 18(c) are cross-sectional views illustrating main producing processes in a semiconductor device producing method according to a thirteenth embodiment. In addition, the thirteenth embodiment is a method for producing the semiconductor device 100 illustrated in FIGS. 1(a), 1(b).

Figure 16A:
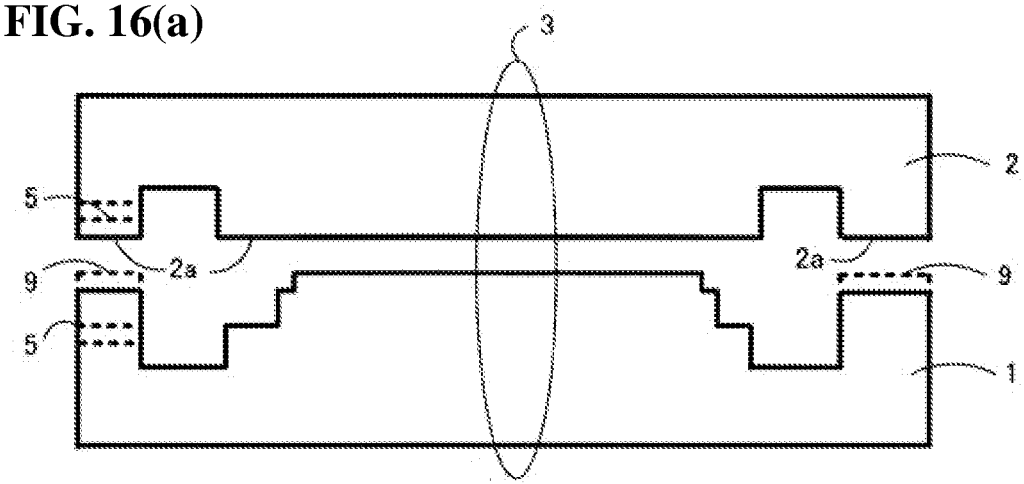
FIGS. 16(a)-16(c) are cross-sectional views sequentially illustrating main producing processes in a semiconductor device producing method according to a thirteenth embodiment (part 1)

As illustrated in FIG. 16(a), a mold 3 including a lower mold 1 and an upper mold 2 is prepared.

Figure 16B:
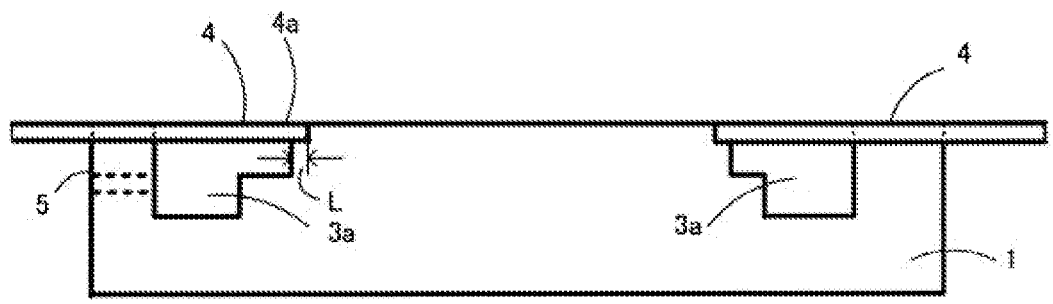

Then, as illustrated in FIG. 16(b), a lead frame 4 made of, for example, Cu is arranged in the lower mold 1.

Figure 16C:
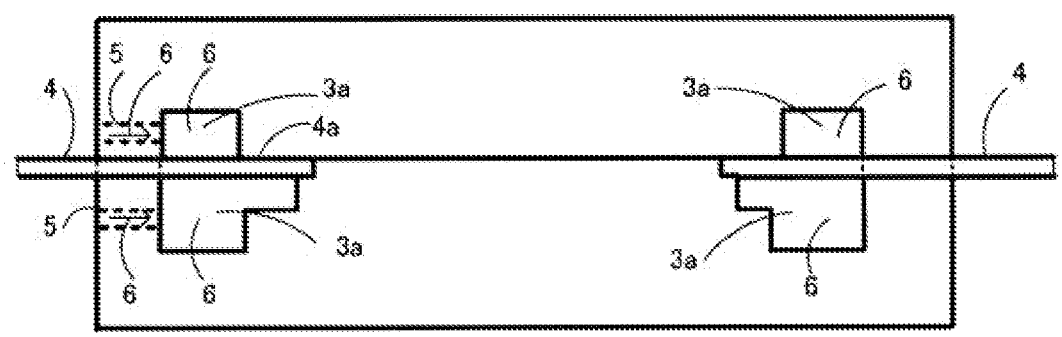

Then, as illustrated in FIG. 16(c), the upper mold 2 is placed on the lower mold 1. In this case, a lower surface 2a of the upper mold 2 close contacts a front surface 4a of the lead frame 4. Then, for example, a PPS resin, which is a molding resin 6, is injected into the mold 3 through injection holes 5 and an internal space 3a of the mold 3 is filled with the molding resin 6.

Figure 17A:
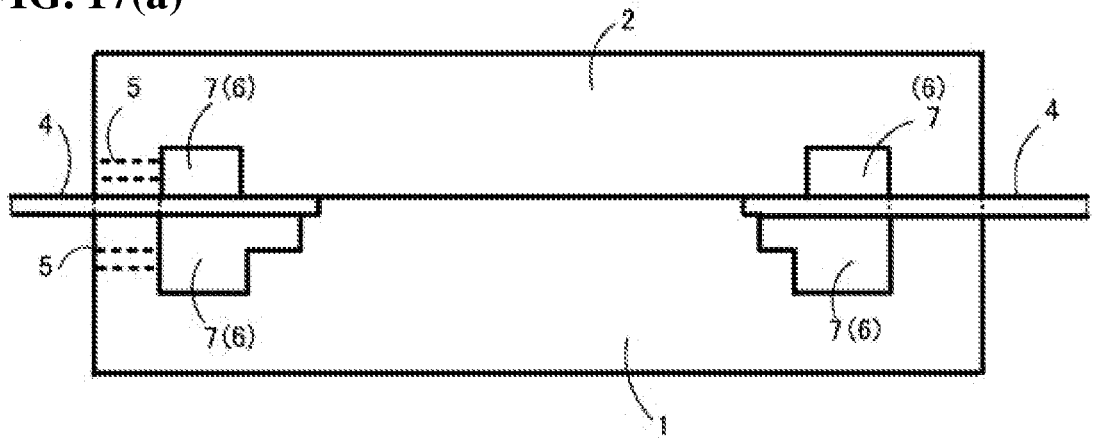
FIGS. 17(a)-17(c) are cross-sectional views sequentially illustrating the main producing processes in the semiconductor device producing method according to the thirteenth embodiment (part 2)

Then, as illustrated in FIG. 17(a), the mold 3 is heated to harden the molding resin 6. The frame 7 is formed by the hardening process and the frame 7 and the lead frame 4 are integrally molded. The lead frame 4 passes through the frame 7 and is fixed to the frame 7.

Figure 17B:

Then, as illustrated in FIG. 17(b), the lower mold 1 and the upper mold 2 are separated from each other and the frame 7 and the lead frame 4 which are integrally molded are detached from the mold 3. In this way, a resin case with the lead frame 4 is completed. The circuit board 12 is prepared in parallel to the above-mentioned processes.

Figure 17C:
Figure 25:
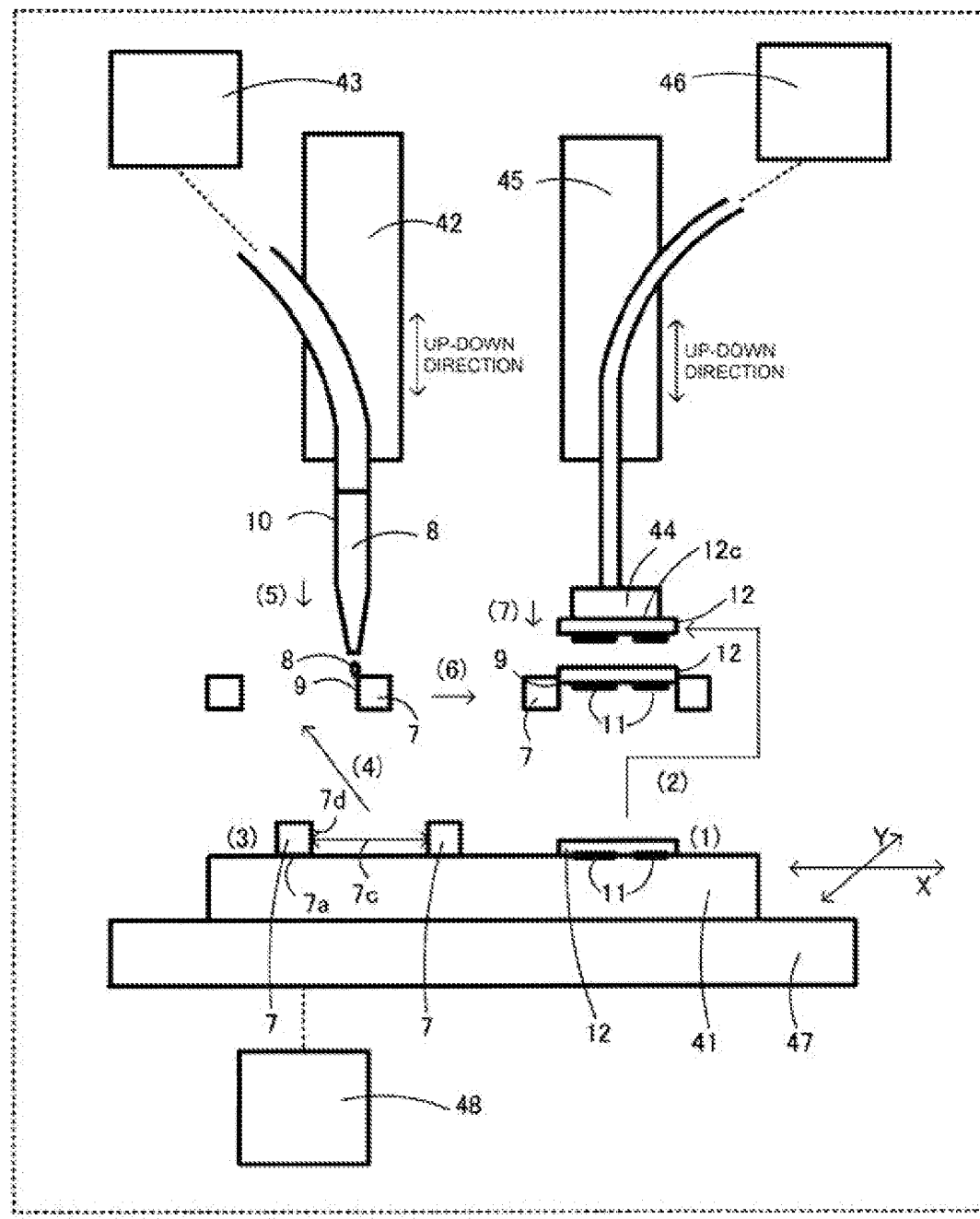
FIG. 25 is a schematic diagram illustrating the structure of an application device which applies an adhesive resin in the thirteenth embodiment, the fourteenth embodiment, and the fifteenth embodiment.
Figure 26:
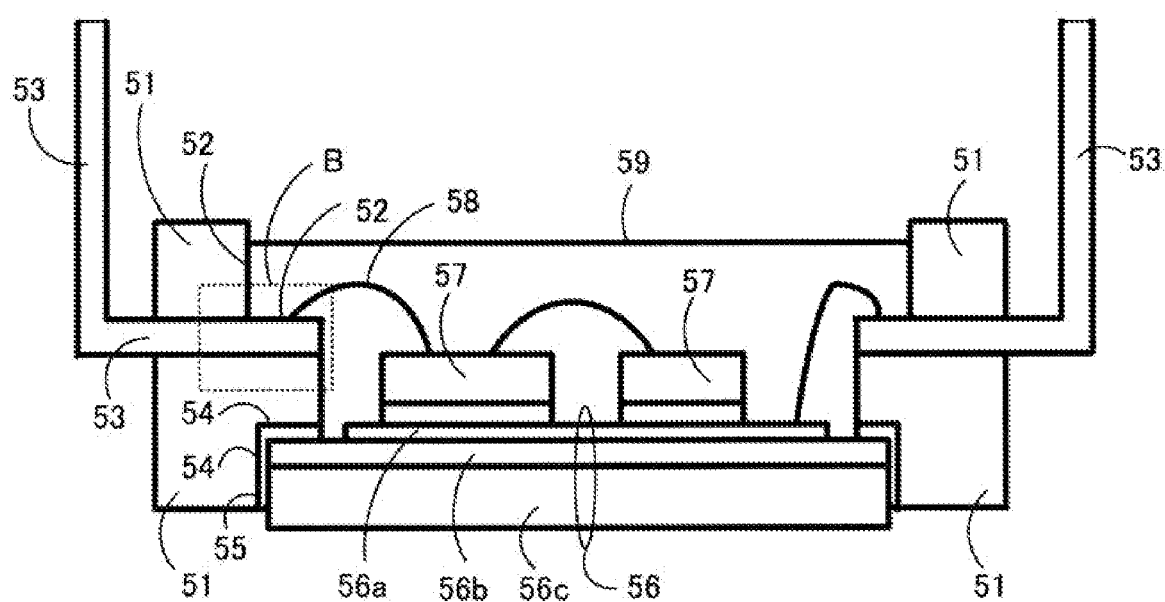
FIG. 26 is a schematic diagram illustrating the structure of a conventional power semiconductor module.
Figure 27:
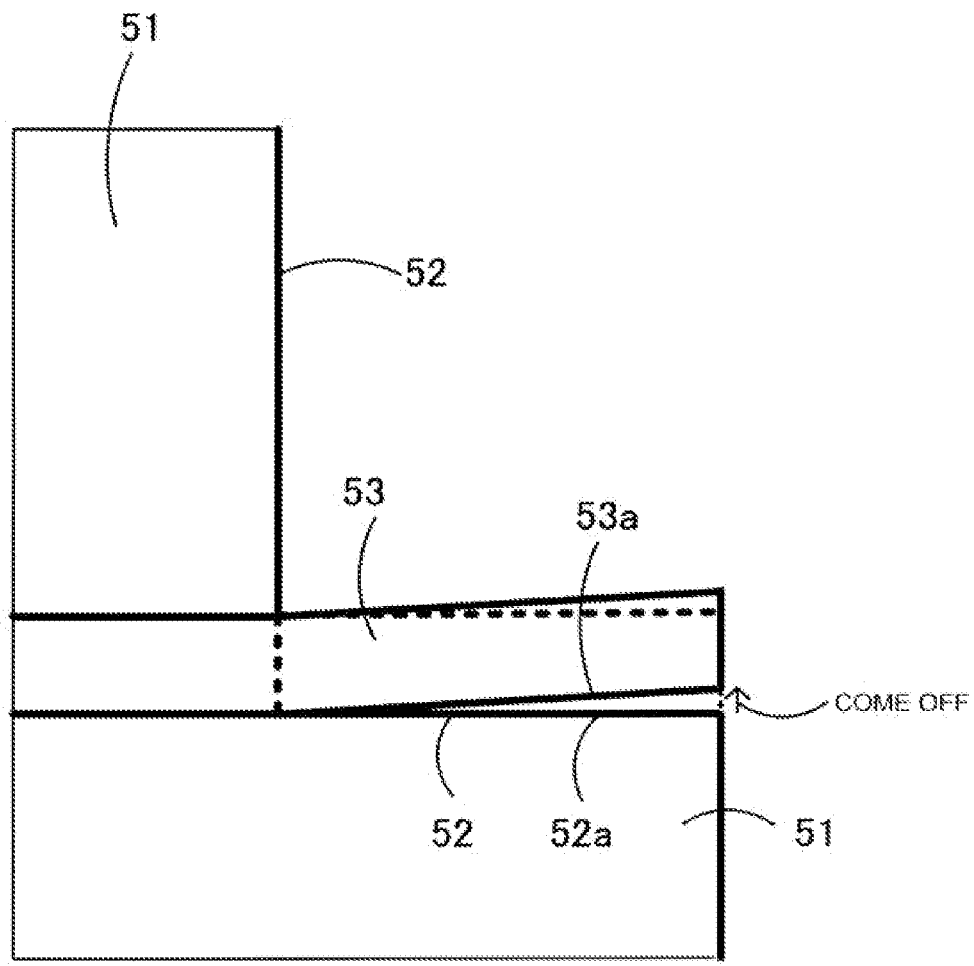
FIG. 27 is a diagram illustrating only a frame and a terminal in the enlarged view of FIG. 26 illustrating a portion B.

Then, as illustrated in FIG. 17(c), the liquid adhesive resin 8 is applied onto the second step portion 9 by a dispenser 10 illustrated in FIG. 25, with the rear surface 7b of the frame 7 up. However, in FIG. 17(c), reference numeral 4b is the rear surface of the lead frame and reference numeral 4c is the end surface of a protruding portion 4e at the leading end of the lead frame. In addition, reference numeral 7a is the front surface of the frame.

Figure 18A:
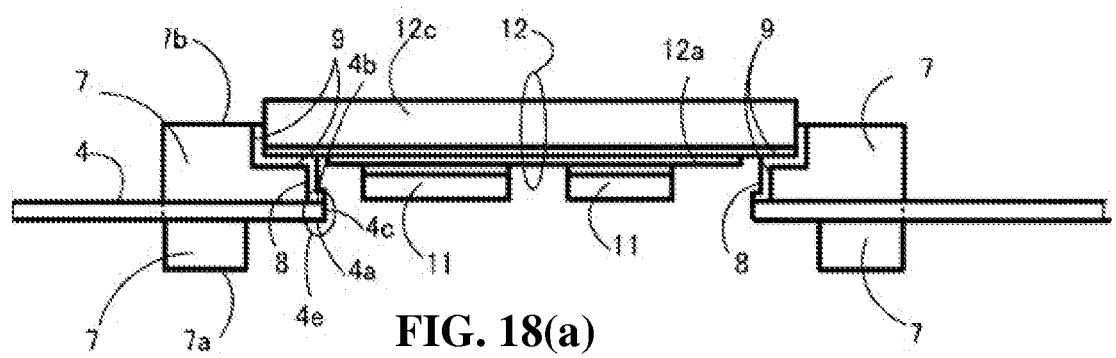
FIGS. 18(a)-18(c) are cross-sectional views sequentially illustrating the main producing processes in the semiconductor device producing method according to the thirteenth embodiment (part 3)

Then, as illustrated in FIG. 18(a), the circuit board 12 having the semiconductor chips 11 fixed thereto is turned upside down such that the surface to which the semiconductor chips 11 are fixed faces downward and the metal plate 12c of the circuit board 12 is fitted to the second step portion 9. In this case, the liquid adhesive resin 8 which is applied onto the second step portion 9 is spread to the rear surface 4b of the protruding portion 4e at the leading end of the lead frame 4. The liquid adhesive resin 8 is applied onto the rear surface 4b and the inner wall 7d of the opening portion 7c of the frame 7. In this case, the adhesive resin 8 may flow to the front surface 4a of the protruding portion 4e at the leading end of the lead frame 4. However, the position where the adhesive resin 8 flows may deviate from a bonding position 35. Then, the entire structure is heated to harden the liquid adhesive resin 8. The circuit board 12 and the rear surface 4b of the protruding portion 4e at the leading end of the lead frame 4 are firmly fixed to the frame 7 through the adhesive resin 8 by the hardening process. For example, a reflow furnace may be used to harden the liquid adhesive resin 8.

Figure 18B:
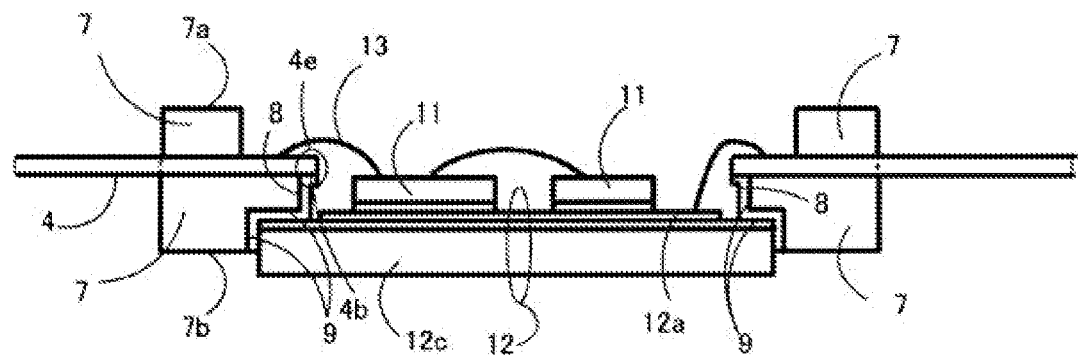

Then, as illustrated in FIG. 18(b), the entire structure is turned again, with the semiconductor chip 11 up, and the wires 13 are fixed to the semiconductor chip 11, the lead frame 4, and the circuit plate 12a of the circuit board 12 by ultrasonic bonding.

Figure 18C:
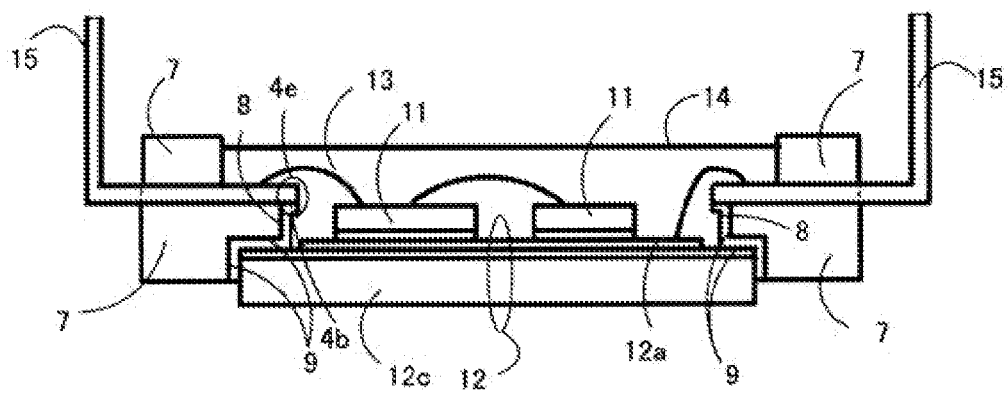
Figure 19A:
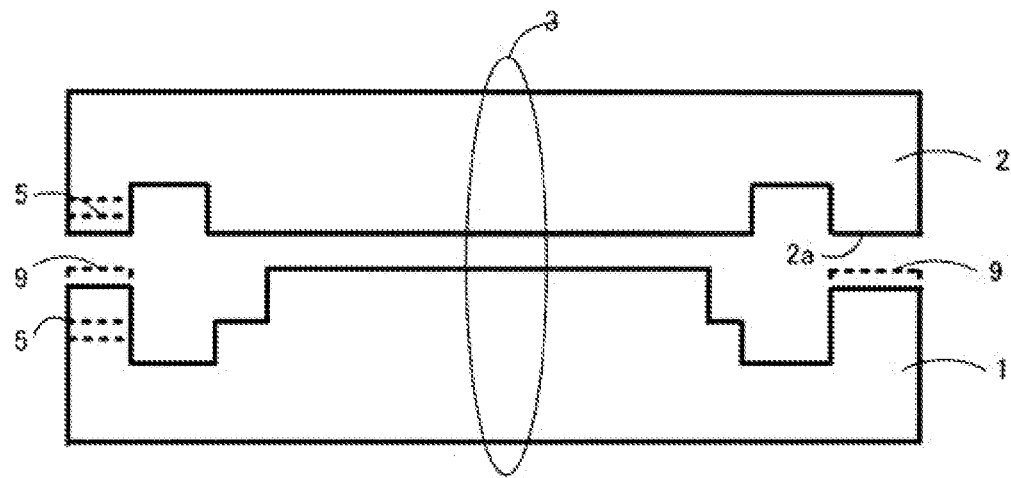
FIGS. 19(a)-19(c) are cross-sectional views sequentially illustrating main producing processes in a semiconductor device producing method according to a fourteenth embodiment (part 1)
Figure 19B:
Figure 19C:
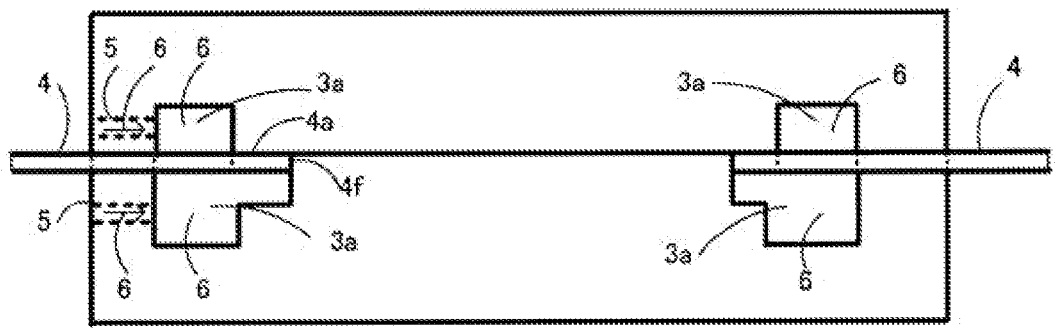

Then, as illustrated in FIG. 18(c), the inside of the frame 7 is filled with the sealing material 14. Then, an unnecessary portion of the lead frame 4 is cut and the lead frame 4 is bent to form the terminal 15. In this way, the semiconductor device 100 is completed.

The adhesive resin 8 is an epoxy-based resin with a viscosity of, for example, about 10 Pa·sec to 50 Pa·sec, preferably, about 16 Pa·sec to 30 Pa·sec and is applied by the dispenser 10. The adhesive resin 8 may be a thermosetting resin which is in a liquid state having a low viscosity and capable of being treated at room temperature, or it may be, for example, a polyimide-based resin or a polyamide-based resin.

The weight of the adhesive resin 8 or the discharge pressure of the adhesive resin 8 can be managed with high accuracy to accurately apply the adhesive resin 8, which flows when the circuit board 12 is fitted to the second step portion 9, from the second step portion 9 to the rear surface 4b of the protruding portion 4e at the leading end of the lead frame 4. However, as described above, a portion of the adhesive resin 8 may flow to the front surface 4a.

The length L of the protruding portion 4e at the leading end of the lead frame 4 may be in the range of, for example, about 0.2 mm to 1 mm in terms of adhesion.

In the integral molding of the frame 7 and the lead frame 4, in some cases, the rear surface 4b of the buried lead frame 4 comes off about 70 μm due to a difference in thermal expansion coefficient, as illustrated in FIG. 4. However, in this case, the adhesive resin 8 with low viscosity flows into the gap 26 and good fixation is obtained.

As illustrated in the semiconductor device 200 of FIGS. 5(a)-5(c), when the adhesive resin 8 is also applied to the end surface 4c of the protruding portion 4e of the lead frame 4, adhesive strength is further improved. In this case, it is necessary to adjust the weight and discharge pressure of the adhesive resin 8 such that the adhesive resin 8 is applied onto the end surface 4c of the protruding portion 4e of the lead frame 4.

Fourteenth Embodiment

FIGS. 19(a) to 21(c) are cross-sectional views illustrating main producing processes in a semiconductor device producing method according to a fourteenth embodiment. In addition, the fourteenth embodiment is a method for producing the semiconductor device 1000 illustrated in FIGS. 13(a)-13(c).

The processes illustrated in FIGS. 19(a) to 20(b) are the same as those illustrated in FIG. 16(a) to FIG. 17(b) in the thirteenth embodiment. The circuit board 12 is prepared in parallel to those processes.

Figure 20A:
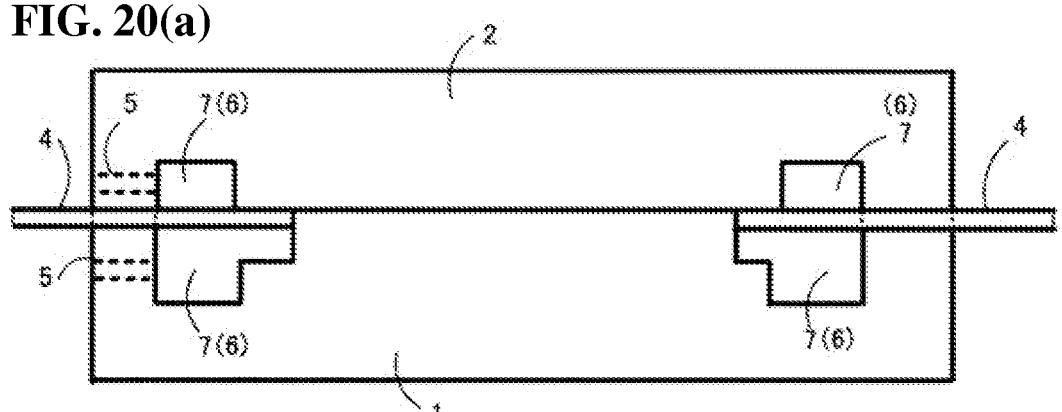
FIGS. 20(a)-20(d) are cross-sectional views sequentially illustrating the main producing processes in the semiconductor device producing method according to the fourteenth embodiment (part 2)
Figure 20B:
Figure 20C:

Then, as illustrated in FIG. 20(c), the frame 7 is placed, with the rear surface 7b up, and the first liquid adhesive resin 18 is applied onto the second step portion 9 by the dispenser 10 illustrated in FIG. 25. The amount of first adhesive resin 18 is less than the amount of adhesive resin 8 in the process illustrated in FIG. 17(c).

Figure 20D:
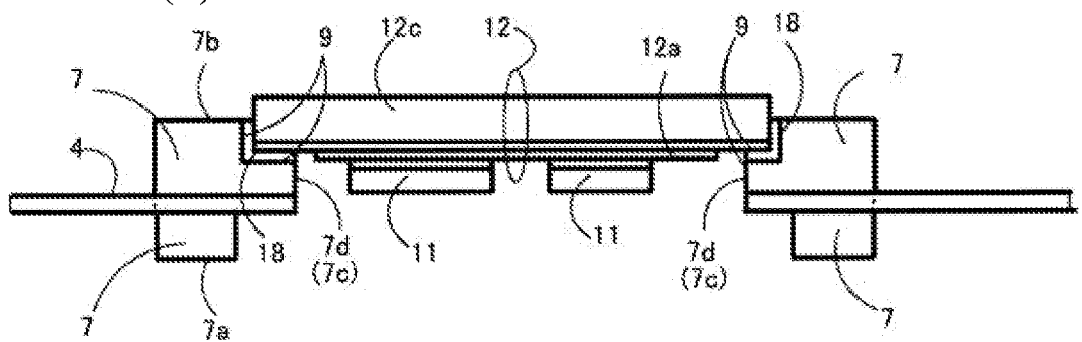

Then, as illustrated in FIG. 20(d), the circuit board 12 having the semiconductor chips 11 fixed thereto is turned upside down such that the surface to which the semiconductor chips 11 are fixed faces downward and the circuit plate 12a of the circuit board 12 is fitted to the second step portion 9. In this case, since the amount of first adhesive resin 18 is small, the first adhesive resin 18 does not flow to the inner wall 7d of the opening portion 7c of the frame 7. Then, the entire structure is heated to harden the first adhesive resin 18. The circuit board 12 is firmly fixed to the frame 7 through the first adhesive resin 18 by the hardening process.

Figure 21A:
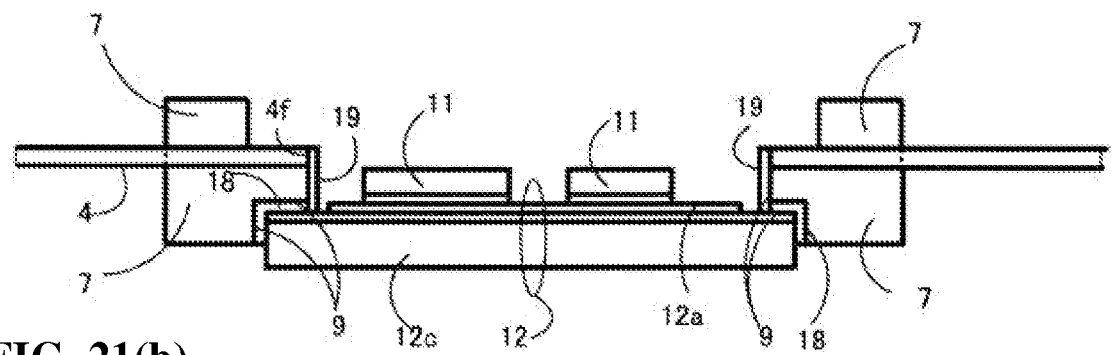
FIGS. 21(a)-(21c) are cross-sectional views sequentially illustrating the main producing processes in the semiconductor device producing method according to the fourteenth embodiment (part 3)
Figure 21B:
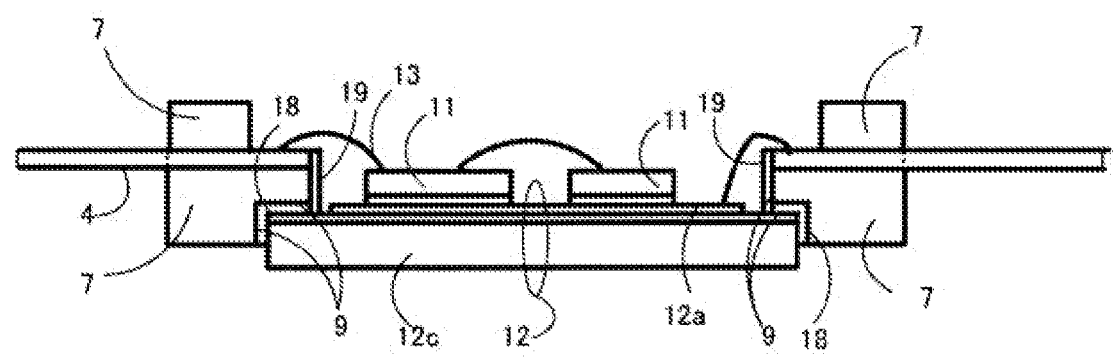

Then, as illustrated in FIG. 21(a), the entire structure is turned and the second adhesive resin 19 is applied onto a side end portion 4f of the leading end of the lead frame 4 and the inner wall 7d of the opening portion 7c of the frame 7. In this case, the second adhesive resin 19 may be applied onto the front surface 4a of the leading end of the lead frame 4. After the second adhesive resin 19 applied onto the front surface 4a is hardened, it is laid on the front surface 4a of the leading end of the lead frame 4. However, the position to which the second adhesive resin flows may deviate from the bonding position 35. The dispenser 10 illustrated in FIG. 25 is also used to apply the second adhesive resin 19. However, other dispensers may be used. Then, the second adhesive resin 19 is hardened. In this way, the lead frame 4 and the frame 7 are firmly fixed to each other by the second adhesive resin 19.

Figure 21C:
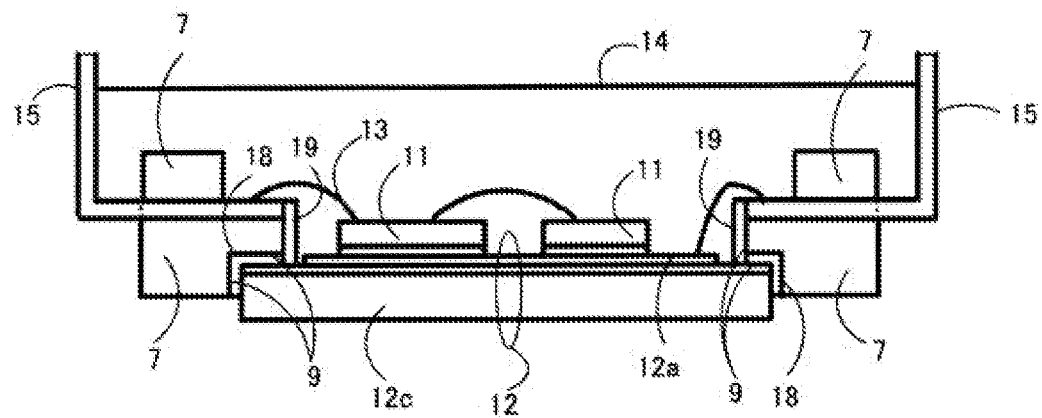

Then, as illustrated in FIG. 21(c), the wires 13 are fixed to the semiconductor chip 11, the lead frame 4, and the circuit plate 12a by ultrasonic bonding.

Then, as illustrated in FIG. 21(c), the inside of the frame 7 is filled with the sealing material 14. Then, an unnecessary portion of the lead frame 4 is cut and the lead frame 4 is bent to form the terminal 15. In this way, the semiconductor device 1000 is completed.

The first adhesive resin 18 and the second adhesive resin 19 may be made of the same material or different materials. For example, an epoxy-based resin, a polyimide-based resin, a polyamide-based resin, or a silicone-based resin may be used as the resins.

When different resins are used, for example, an epoxy-based resin is used as the first adhesive resin 18 and a polyimide-based resin is used as the second adhesive resin 19. For example, a reflow furnace may be used to harden the adhesive resins 18 and 19.

Fifteenth Embodiment

FIGS. 22(a) to 24 are cross-sectional views illustrating main producing processes in a semiconductor device producing method according to a fifteenth embodiment. In addition, the fifteenth embodiment is a method for producing the semiconductor device 500 illustrated in FIGS. 8(a)-8(c).

Figure 22A:
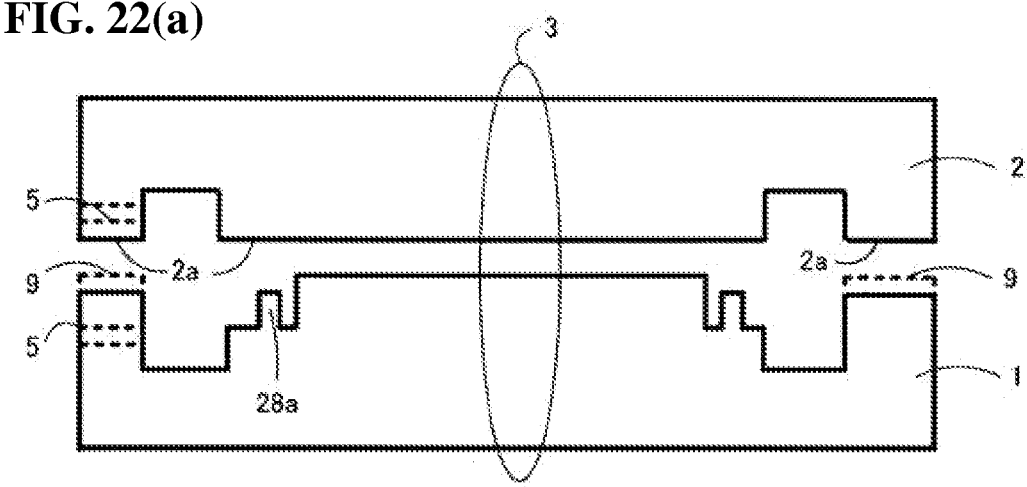
FIGS. 22(a)-22(c) are cross-sectional views sequentially illustrating main producing processes in a semiconductor device producing method according to a fifteenth embodiment (part 1)

As illustrated in FIG. 22(a), a mold 3 including a lower mold 1 and an upper mold 2 is prepared.

Figure 22B:
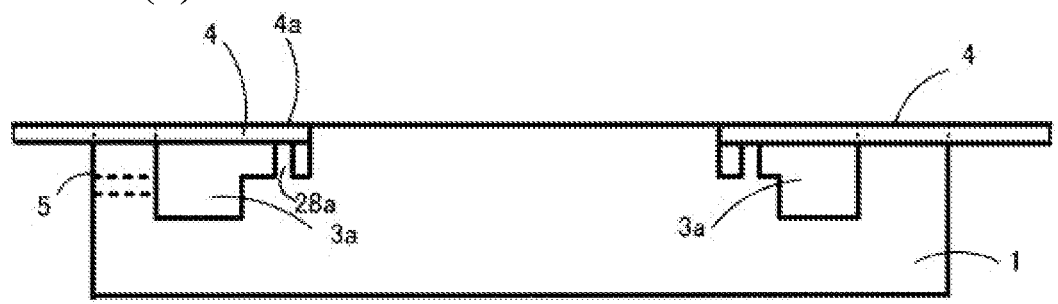

Then, as illustrated in FIG. 22(b), the lead frame 4 made of, for example, Cu is arranged in the lower mold 1. A projection portion 28a is provided in the lower mold 1 such that the through hole 28 is formed from the first step portion 21 of the frame 7 to the second step portion 9.

Figure 22C:
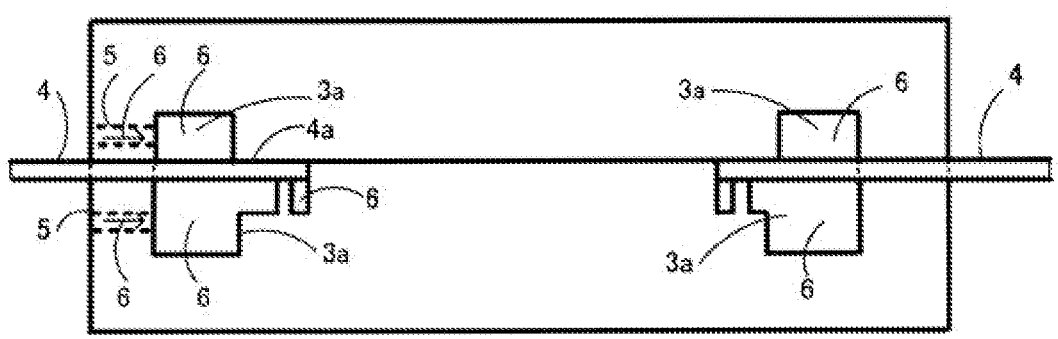

Then, as illustrated in FIG. 22(c), the upper mold 2 is placed on the lower mold 1. In this case, a lower surface 2a of the upper mold 2 close contacts a front surface 4a of the lead frame 4. Then, for example, a PPS resin, which is the molding resin 6, is injected into the mold 3 through the injection holes 5 and an internal space 3b of the mold 3 is filled with the molding resin 6.

Figure 23A:
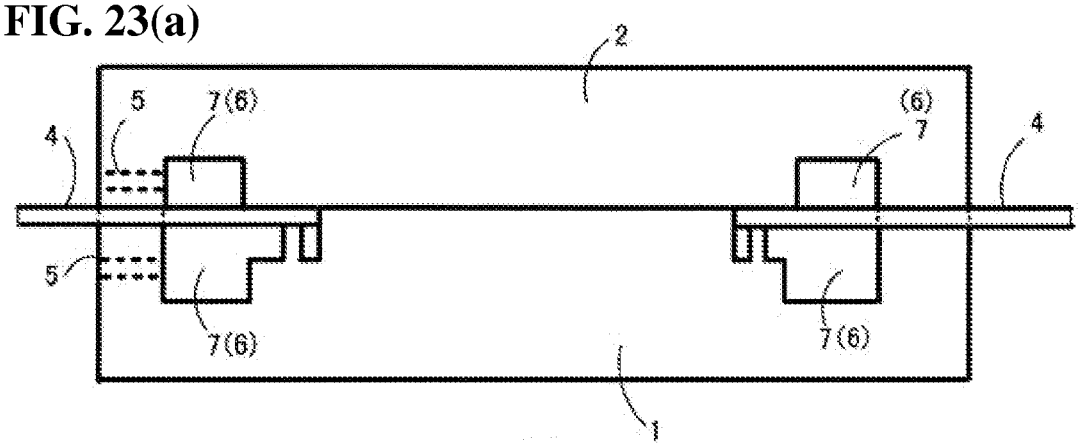
FIGS. 23(a)-23(c) are cross-sectional views sequentially illustrating the main producing processes in the semiconductor device producing method according to the fifteenth embodiment (part 2)

Then, as illustrated in FIG. 23(a), the mold 3 is heated to harden the molding resin 6. The frame 7 having the through hole 28 is formed by the hardening process and the frame 7 and the lead frame 4 are integrally molded. The lead frame 4 passes through the frame 7 and is fixed to the frame 7.

Figure 23B:

Then, as illustrated in FIG. 23(b), the lower mold 1 and the upper mold 2 are separated from each other and the frame 7 and the lead frame 4 which are integrally molded are detached from the mold 3. In this way, a resin case with the lead frame 4 is completed. The circuit board 12 is prepared in parallel to the above-mentioned processes.

Figure 23C:

Then, as illustrated in FIG. 23(c), the liquid adhesive resin 8 is applied onto the second step portion 9 by the dispenser 10 illustrated in FIG. 25, with the rear surface 7b of the frame 7 up, such that the through hole 28 is filled with the adhesive resin 8.

Figure 24:
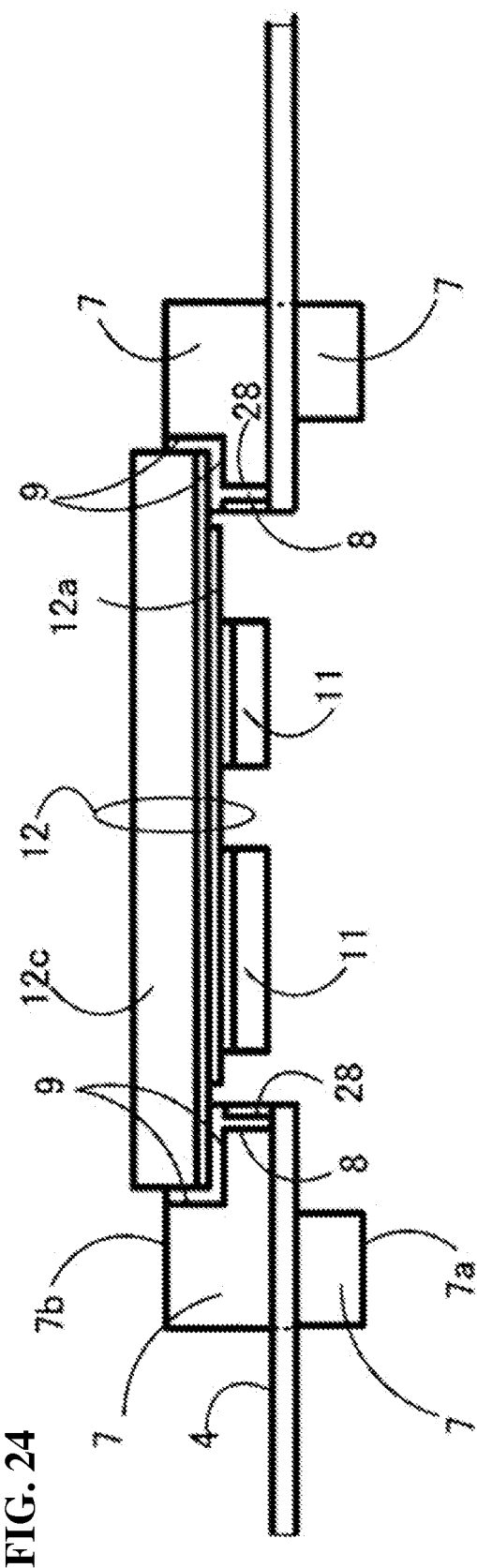
FIG. 24 is a cross-sectional view sequentially illustrating the main producing processes in the semiconductor device producing method according to the fifteenth embodiment (part 3)

Then, as illustrated in FIG. 24, the circuit board 12 having the semiconductor chips 11 fixed thereto is turned upside down such that the surface to which the semiconductor chips 11 are fixed faces downward and the metal plate 12c of the circuit board 12 is fitted to the second step portion 9. Then, the entire structure is heated to harden the liquid adhesive resin 8. Then, the circuit board 12 is firmly fixed to the second step portion 9 through the adhesive resin 8 and the rear surface 4b of the lead frame 4 is firmly hardened to the frame 7 through the adhesive resin 8 filled in the through hole 28. For example, a reflow furnace may be used to harden the liquid adhesive resin 8.

The subsequent processes are the same as those illustrated in FIGS. 18(b) and 18(c). In this way, the semiconductor device 500 is completed.

FIG. 25 is a schematic diagram illustrating the structure of an application device which is used to apply the adhesive resin in the thirteenth embodiment, the fourteenth embodiment, and the fifteenth embodiment. The application device can also be applied to the adhesive resins 18 and 19.

An application device 150 applies the adhesive resin 8 onto the inner wall 7d of the opening portion 7c of the frame 7 and includes a supporting table 41 which can be moved along the X-axis and the y-axis, the dispenser 10, and an attachment support 42 for the dispenser 10 which can be moved along the Z-axis. The application device 150 further includes a discharge control unit 43 that instructs the dispenser 10 to discharge the adhesive resin 8 and controls the amount of discharge and discharge pressure of the resin. In addition, the application device 150 includes a suction portion 44 which sucks the circuit board 12, and a suction portion attachment support 45 which can be moved along the Z-axis, and a suction control unit 46 which controls the suction of air by the suction portion 44. The application device 150 further includes a moving portion 47 which moves the supporting table 41 and a movement control unit 48 which outputs instructions to the moving portion 47. In FIG. 25, numbers in parentheses indicates process numbers.

Next, a process of applying the adhesive resin 8 onto the inner wall 7d of the opening portion 7c of the frame 7 will be described with reference to FIG. 25.

First, in a process (1), the circuit board 12 is placed on the supporting table 41, with the semiconductor chip 11 down.

Then, in a process (2), the movement control unit 48 moves the moving portion 47 in the X direction and the Y direction to move the supporting table 41 such that the circuit board 12 is located immediately below the suction portion 44. Then, the suction portion 44 is moved down so as to contact the circuit board 12. Then, the suction control unit 46 controls the suction portion 44 such that the metal plate 12c of the circuit board 12 close contacts the suction portion 44.

Then, in a process (3), the frame 7 is placed on the supporting table 41, with the front surface 7a down. When the frame 7 is also placed in the process (1), the process (3) is not performed.

Then, in a process (4), the movement control unit 48 moves the moving portion 47 in the X direction and the Y direction to move the supporting table 41 such that the second step portion 9 of the frame 7 is located immediately below the dispenser 10.

Then, in a process (5), the dispenser 10 is moved down to be close to the second step portion 9 of the frame 7 and applies the appropriate amount of adhesive resin 8 which is controlled by the discharge control unit 43 onto the second step portion 9 of the frame 7.

Then, in a process (6), the movement control unit 48 moves the moving portion 47 in the X direction and the Y direction to move the supporting table 41 such that the frame 7 is located immediately below the circuit board 12.

Then, in a process (7), the circuit board 12 is moved down and is fitted to the second step portion 9 of the frame 7. In this case, the adhesive resin 8 applied onto the second step portion 9 is compressed and flows to the rear surface 4b of the protruding portion 4e at the leading end of the lead frame 4, as illustrated in FIG. 18(a). In addition, the adhesive resin 8 may flow to the end surface 4c. In this case, the amount of adhesive resin 8 applied is managed such that the adhesive resin 8 does not flow to the end surface 4c or the front surface 4a of the protruding portion 4e of the lead frame 4.

The series of processes (1) to (7) can be automatically performed to improve mass productivity. Therefore, it is possible to reduce production costs.

In the process (5), when the adhesive resin 8 is discharged to the inner wall 7d of the opening portion 7c of the frame 7, the discharge control unit 43 appropriately controls the discharge amount or discharge speed of the adhesive resin 8 such that the dispenser 10 discharges the appropriate amount of adhesive resin 8 to the second step portion 9 of the frame 7. The supporting table 41 is moved such that the adhesive resin 8 discharged from the dispenser 10 is uniformly applied onto the second step portion 9 of the frame 7. When the circumferential length of the second step portion 9 of the frame 7 is, for example, about 75 mm, the appropriate weight of the adhesive resin 8 is set to, for example, about 100 mg and the discharge pressure thereof is set to, for example, about 1.5× 9.8 N in order to appropriately apply the adhesive resin 8.

Although not illustrated in the drawings, when the adhesive resins 18 and 19 made of two kinds of materials are used, the supporting table 41 is moved by a conveyer belt, with the first adhesive resin 18 being applied, and the first adhesive resin 18 is hardened by the reflow furnace. Then, the supporting table 41 is moved to the place where a second application device is installed by the conveyer and the frame 7 is turned upside down. Then, the second adhesive resin 19 is applied. Then, the frame 7 is moved by another conveyer belt and the second adhesive resin 19 is hardened by another reflow furnace. The series of operations is automatically performed to rapidly perform the application and hardening of the adhesive resins 18 and 19. Therefore, it is possible to improve mass productivity and to reduce production costs.

Only the principle of the invention has been described above. Various modifications and changes of the invention can be made by those skilled in the art. The invention is not limited to the above-mentioned exact structures and applications and all of modifications and equivalents corresponding thereto are regarded as the scope of the invention defined by the appended claims and their equivalents.

EXPLANATIONS OF LETTERS OR NUMERALS

1 LOWER MOLD
2 UPPER MOLD
3 MOLD
4 LEAD FRAME
4a, 7a, 15a, 21a FRONT SURFACE
4b, 7b, 15b REAR SURFACE
4c, 15c, 15f END SURFACE
4e, 15e PROTRUDING PORTION
5 INJECTION HOLE
6 MOLDING RESIN
7 FRAME
7c OPENING PORTION
7d INNER WALL
8 ADHESIVE RESIN
9 SECOND STEP PORTION
10 DISPENSER
11 SEMICONDUCTOR CHIP
12 CIRCUIT BOARD
12a CIRCUIT PLATE
12b INSULATING FILM
12c METAL PLATE
13 WIRE
14 SEALING MATERIAL
15 TERMINAL
15d SIDE SURFACE
18 FIRST ADHESIVE RESIN
19 SECOND ADHESIVE RESIN
21 FIRST STEP PORTION
22 ATTACHMENT HOLE

25 ULTRASONIC BONDING DEVICE
26 GAP
27, 33 VOID
28, 29 THROUGH HOLE
28a PROJECTION PORTION
35 BONDING POSITION
41 SUPPORTING TABLE
42 ATTACHMENT SUPPORT
43 DISCHARGE CONTROL UNIT
44 SUCTION PORTION
45 SUCTION PORTION ATTACHMENT SUPPORT
46 SUCTION CONTROL UNIT
47 MOVING PORTION
48 MOVEMENT CONTROL UNIT
100 TO 1200 SEMICONDUCTOR DEVICE
150 APPLICATION DEVICE

What is claimed is:

1. A method for producing a semiconductor device comprising:
    a step of preparing a frame including a first step portion provided in a ring shape in an inner circumference of one main surface of the frame, a terminal fixed to the first step portion, a second step portion provided in a ring shape in an inner circumference of another main surface of the frame, and an inner wall provided between the first step portion and the second step portion;
    a step of preparing a circuit board;
    a step of applying a first adhesive resin onto the second step portion while the one main surface of the frame is facing downward;
    a step of fitting the circuit board to the second step portion; and
    a step of applying a second adhesive resin onto the inner wall and the terminal while the one main surface of the frame is facing upward.

2. The method for producing a semiconductor device according to claim 1, wherein the first adhesive resin and the second adhesive resin are one of an epoxy-based resin, a polyimide-based resin, a polyamide-based resin, or a silicone-based resin.

3. A method for producing a semiconductor device comprising:
    a step of preparing a frame including a first step portion provided in a ring shape in an inner circumference of one main surface of the frame, a terminal fixed to the first step portion, a second step portion provided in a ring shape in an inner circumference of another main surface of the frame, an inner wall provided between the first step portion and the second step portion, and a through hole passing through the first step portion and the second step portion;
    a step of preparing a circuit board;
    a step of applying an adhesive resin onto the second step portion while the one main surface of the frame is facing downward, and filling the through hole with the adhesive resin; and
    a step of fitting the circuit board to the second step portion.

4. The method for producing a semiconductor device according to claim 3, wherein the adhesive resin is one of an epoxy-based resin, a polyimide-based resin, a polyamide-based resin, or a silicone-based resin.

5. A method for producing a semiconductor device comprising:
    a step of preparing a frame including a first step portion provided in a ring shape in an inner circumference of one main surface of the frame, a terminal fixed to the first step portion, a second step portion provided in a ring shape in an inner circumference of another main surface of the frame, and an inner wall provided between the first step portion and the second step portion;
    a step of preparing a circuit board;
    a step of applying an adhesive resin onto the second step portion while the one main surface of the frame is facing downward; and
    a step of fitting the circuit board to the second step portion to press the adhesive resin, thereby applying the adhesive resin onto the inner wall and the terminal.

6. The method for producing a semiconductor device according to claim 5, wherein the terminal includes a protruding portion provided at a leading end portion thereof close to the first step portion and protruding from the inner wall, and the pressed adhesive resin is applied onto a surface of the protruding portion close to the inner wall.

7. A semiconductor device comprising:
    a frame comprising
        a first step portion provided in a ring shape in an inner circumference of one main surface of the frame,
        a second step portion provided in a ring shape in an inner circumference of another main surface of the frame, and
        an inner wall provided between the first step portion and the second step portion;
    a terminal leading from the first step portion to outside;
    a circuit board fitted to the second step portion; and
    an adhesive resin bonding the second step portion and the circuit board, and contacting the inner wall and the terminal.

8. The semiconductor device according to claim 1, wherein the adhesive resin is an epoxy-based resin, a polyimide-based resin, a polyamide-based resin, or a silicone-based resin.

9. The semiconductor device according to claim 7, wherein the terminal includes a protruding portion provided at a leading end portion of the first step portion and protruding from the inner wall, and the adhesive resin contacts a surface of the protruding portion close to the inner wall.

10. The semiconductor device according to claim 9, wherein the adhesive resin contacts an end surface of the protruding portion of the terminal.

11. The semiconductor device according to claim 1, wherein the frame includes a locking portion provided in the first step portion to press the terminal in a direction from the one main surface to said another main surface.

12. The semiconductor device according to claim 11, wherein the locking portion is formed integrally with the frame.

13. The semiconductor device according to claim 1, wherein a leading end portion of the terminal close to the first step portion is substantially flush with the inner wall, and the adhesive resin contacts the leading end portion.

14. The semiconductor device according to claim 13, wherein the adhesive resin bonds a surface of the first step portion and the terminal disposed on the surface of the first step portion.

15. The semiconductor device according to claim 13, wherein the adhesive resin includes:
    a first adhesive resin bonding the second step portion and the circuit board; and
    a second adhesive resin bonding the inner wall and the terminal.

16. A semiconductor device comprising:
    a frame comprising
        a first step portion provided in a ring shape in an inner circumference of one main surface of the frame, a second step portion provided in a ring shape in an inner circumference of another main surface of the frame,
an inner wall provided between the first step portion and the second step portion, and
a through hole passing through the first step portion and the second step portion;

a terminal leading from the first step portion to outside;
a circuit board fitted to the second step portion; and
an adhesive resin bonding the second step portion and the circuit board, and filling in the through hole, the adhesive resin contacting the terminal.

17. The semiconductor device according to claim 16, wherein a leading end portion of the terminal close to the first step portion is substantially flush with the inner wall, and
the adhesive resin contacts the inner wall and the leading end portion.

18. The semiconductor device according to claim 16, wherein the through hole has a width larger than that of the terminal.

19. A semiconductor device comprising:
a frame comprising
a first step portion provided in a ring shape in an inner circumference of one main surface of the frame,
a second step portion provided in a ring shape in an inner circumference of another main surface of the frame, and
an inner wall provided between the first step portion and the second step portion;

a terminal leading from the first step portion to outside;
a circuit board fitted to the second step portion;
a first adhesive resin bonding the second step portion and the circuit board; and
a second adhesive resin,
wherein the frame includes a void formed in the first step portion at a position corresponding to a side of the terminal, and the second adhesive resin is arranged in the void.

* * * * *

UNITED STATES PATENT AND TRADEMARK OFFICE
CERTIFICATE OF CORRECTION

PATENT NO. : 9,299,642 B2
APPLICATION NO. : 14/842230
DATED : March 29, 2016
INVENTOR(S) : Yuhei Nishida et al.

It is certified that error appears in the above-identified patent and that said Letters Patent is hereby corrected as shown below:

Specification

Please change column 1, line 10, from "... No. 2013-filed ..." to --... No. 2013-121931 filed ...--.

Signed and Sealed this
Twenty-first Day of June, 2016

Michelle K. Lee
*Director of the United States Patent and Trademark Office*